United States Patent
Pappas et al.

(10) Patent No.: US 10,964,238 B2
(45) Date of Patent: Mar. 30, 2021

(54) DISPLAY DEVICE TESTING AND CONTROL

(71) Applicant: Facebook Technologies, LLC, Menlo Park, CA (US)

(72) Inventors: Ilias Pappas, Cork (IE); William Thomas Blank, Bellevue, WA (US)

(73) Assignee: Facebook Technologies, LLC, Menlo Park, CA (US)

(*) Notice: Subject to any disclaimer, the term of this patent is extended or adjusted under 35 U.S.C. 154(b) by 0 days.

(21) Appl. No.: 16/261,403

(22) Filed: Jan. 29, 2019

(65) Prior Publication Data

US 2020/0211427 A1  Jul. 2, 2020

(51) Int. Cl.
| | |
|---|---|
| G09G 3/00 | (2006.01) |
| G09G 3/32 | (2016.01) |
| G01R 31/26 | (2020.01) |
| G02B 26/10 | (2006.01) |
| G02B 26/08 | (2006.01) |

(52) U.S. Cl.
CPC ......... G09G 3/006 (2013.01); G01R 31/2635 (2013.01); G09G 3/32 (2013.01); *G02B 26/0816* (2013.01); *G02B 26/10* (2013.01); *G09G 2320/064* (2013.01)

(58) Field of Classification Search
CPC .... G09G 3/006; G09G 3/32; G09G 2320/064; G09G 3/346; G01R 31/2635; G02B 26/10; G02B 26/0816
See application file for complete search history.

(56) References Cited

U.S. PATENT DOCUMENTS

| | | | |
|---|---|---|---|
| 9,466,240 B2 * | 10/2016 | Jaffari | G09G 3/3208 |
| 2010/0253706 A1 * | 10/2010 | Shirouzu | G09G 3/2092 |
| | | | 345/690 |
| 2015/0192634 A1 * | 7/2015 | Lewis | G01R 31/2621 |
| | | | 324/762.09 |
| 2016/0225314 A1 * | 8/2016 | Lee | G09G 3/006 |
| 2018/0151112 A1 * | 5/2018 | Song | G09G 3/006 |

* cited by examiner

*Primary Examiner* — Xuemei Zheng
(74) *Attorney, Agent, or Firm* — Kilpatrick Townsend & Stockton

(57) ABSTRACT

Systems and methods for controlling a display apparatus are provided. In one example, an apparatus comprises a display comprising a plurality of light emitting diodes (LED), a display control circuit configured to generate display control signals, and a test module configured to generate test control signals. In a test operation mode, at least one LED of the plurality of LEDs is configured to be controlled by the test control signals from the test module to conduct at least one test output current. The test module can determine electrical characteristics of the at least one LED based on the at least one test output current. The display control circuit can adjust the display control signals based on the electrical characteristics of the at least one LED.

20 Claims, 19 Drawing Sheets

DISPLAY DEVICE TESTING AND CONTROL

CROSS REFERENCE TO RELATED APPLICATIONS

This application claims the benefit and priority under 35 U.S.C. 119(a)-(d) of Greece Patent Application No. 20180100578, entitled "Display Device Testing And Control," filed Dec. 20, 2018, the contents of which are incorporated herein in their entirety for all purposes.

BACKGROUND

The disclosure relates generally to display, and more specifically to testing and control of display devices.

Displays are ubiquitous and are a core component of wearable devices, smart phones, tablets, laptops, desktops, TVs and display systems. Common display technologies today include Light Emitting Diode (LED) displays. A display can be created by assembling an array of LED display devices. Each LED display device of the array can be controlled, based on certain expected electrical characteristics of the LED display devices, to output light of a target intensity to display an image. The electrical characteristics of the LED display devices may change with time, which may affect the output intensities of the LED display devices.

SUMMARY

The present disclosure relates to display, and more specifically to dynamically adjusting control signals to display devices based on testing of the display devices.

In one example, an apparatus is provided. The apparatus comprises: a display comprising a plurality of light emitting diodes (LED), a display control circuit configured to generate display control signals, and a test module configured to generate test control signals. In a first operation mode, the plurality of LEDs are configured to be controlled by the display control signals from the display control circuit, at least a first subset of the plurality of LEDs being involved in outputting of an image based on the display control signals. In a second operation mode: at least one LED of the plurality of LEDs is configured to be controlled by the test control signals from the test module to conduct at least one test output current. The test module is further configured to determine electrical characteristics of the at least one LED based on the at least one test output current, and provide data related to the electrical characteristics of the at least one LED to the display control circuit, to enable the display control circuit to adjust the display control signals based on the electrical characteristics of the at least one LED.

In some aspects, a second subset of the plurality of LEDs is not involved in the outputting of the image. The at least one LED is part of the second subset of the plurality of LEDs. In some examples, the at least one LED is part of the first subset of the plurality of LEDs.

In some aspects, the apparatus is configured to enter the second operation mode at a time between when the display outputs a first image frame and when the display outputs a second image frame. In some aspects, the apparatus further comprises a rotatable mirror configured to rotate from a first angle towards a second angle relative to the display to reflect light of different rows of the plurality of LEDs to a user at different times to output the first image frame. The apparatus is configured to enter the second operation mode when the rotatable mirror rotates from the second angle back to the first angle to start outputting the second image frame.

In some aspects, the apparatus is configured to enter the second operation mode between non-uniform time intervals; wherein the non-uniform time intervals increase with time.

In some aspects, the apparatus further comprises display driver circuits configured to, in the first operation mode: generate display driving signals based on the display control signals from the display control circuit, and provide the display driving signals to the plurality of LEDs. The display driver circuits are further configured to, in the second operation mode: generate test driving signals based on the test control signals from the test module, and provide the test driving signals to the at least one LED.

In some aspects, the test driving signals are configured to set a first voltage across the at least one LED. The at least one test output current is conducted by the at least one LED in response to the first voltage.

In some aspects, the test driving signals are configured to set a plurality of voltages across the at least one LED at different times within the second operation mode. The display driver circuits are configured to exit the second operation mode when the at least one test output current conducted by the at least one LED responsive to one of the plurality of voltages reaches a target current.

In some aspects, the test module includes: a current measurement device configured to measure the at least one test output current, a comparator configured to compare an output of the current measurement device and the target current to provide an indication of whether the at least one current matches the target current, a counter configured adjust a count value based on the indication from the comparator that the at least one current matches the target current, and a digital-to-analog converter (DAC) configured to generate the test driving signals based on the count value from the counter.

In some aspects, the test module is configured to: provide different sets of test control signals to the display driver circuits to obtain measurement data of a plurality of voltages across the at least one LED and to obtain a plurality of currents that flow through the at least one LED in response to the plurality of voltages; and determine the electrical characteristics of the at least one LED by mapping the plurality of currents to the plurality of voltages.

In some aspects, the display driver circuits include a first transistor configured as variable current source, a gate terminal of the first transistor being driven by the test driving signals in the second operation mode, and a source terminal of the first transistor being coupled with the at least one LED. The test control signals comprises a first test control signal and a second test control signal, the gate terminal of the first transistor being driven by the first test control signal in the second operation mode. In some examples, the apparatus further comprises a second transistor configured as a voltage buffer. A drain terminal of the first transistor is coupled with an voltage output of the voltage buffer, and a gate terminal of the second transistor is driven by the second test control signal in the second operation mode.

In some aspects, the test module is configured to: determine, at a first time, first electrical characteristics of the at least one LED; and obtain data of second electrical characteristics of the at least one LED, the second electrical characteristics being associated with a second time prior to the first time. The data related to the electrical characteristics of the at least one LED comprise data related to a difference between the first electrical characteristics and the second electrical characteristics.

In some aspects, the display control signals generated by the display control circuit comprise a first pulse width modulation (PWM) signal, a first duty cycle of the first PWM signal being set to control a perceived intensity of light output by the at least one LED. The display control circuit is configured adjust the first duty cycle of the first PWM signal based on the difference such that a perceived intensity of light output by the at least one LED at the first time is substantially equal to a perceived intensity of light output by the at least one LED at the second time.

In some aspects, the display control signals generated by the display control circuit comprises a second PWM signal, a second duty cycle of the second PWM signal being set to control a perceived intensity of light output by a second LED of the plurality of LEDs. The display control circuit is configured adjust the second duty cycle of the second PWM signal based on the difference and an intensity factor between the at least one LED and the second LED, such that a perceived intensity of light output by the second LED at the first time is substantially equal to a perceived intensity of light output by the second LED at the second time.

In some aspects, the display control signals generated by the display control circuit comprise a first current setting signal, the first current setting signal being set to control the at least one current generated by the at least one LED. The display control circuit is configured adjust the first current setting signal based on the difference such that an intensity of light output by the at least one LED at the first time is substantially equal to an intensity of light output intensity of light output by the at least one LED at the second time.

In some aspects, the display control signals generated by the display control circuit comprise a second current setting signal, the second current setting signal being set to control a second current that flows through a second LED. The display control circuit is configured adjust the second current setting signal based on the difference and an intensity factor between the at least one LED and the second LED, such that an intensity of light output by the second LED at the first time is substantially equal to an intensity of light output by the second LED at the second time.

In one example, a method is provided. The method comprises, in a first operation mode, controlling a plurality of LEDs of a display based on display control signals from a display control circuit to output an image. The method further comprises, in a second operation mode: controlling at least one LED of the plurality of LEDs based on test control signals from a test module to conduct at least one current; measuring, by the test module, the at least one current; determining, by the test module, electrical characteristics of the at least one LED based on the at least one current; and providing, by the test module to the display control circuit, data related to the electrical characteristics of the at least one LED, to enable the display control circuit to adjust the display control signals based on the electrical characteristics of the at least one LED.

In some aspects, the method further comprises, in the second operation mode: comparing the at least one current against a target current to determine whether the at least one current matches the target current; adjusting the test control signals to adjust the at least one current based on a result of the comparison; and responsive to determining that the at least one current matches the target current: storing a mapping between a voltage included in the test control signals and the target current to represent the electrical characteristics of the at least one LED.

BRIEF DESCRIPTION OF THE DRAWINGS

Illustrative embodiments are described with reference to the following figures.

Figure 1A:
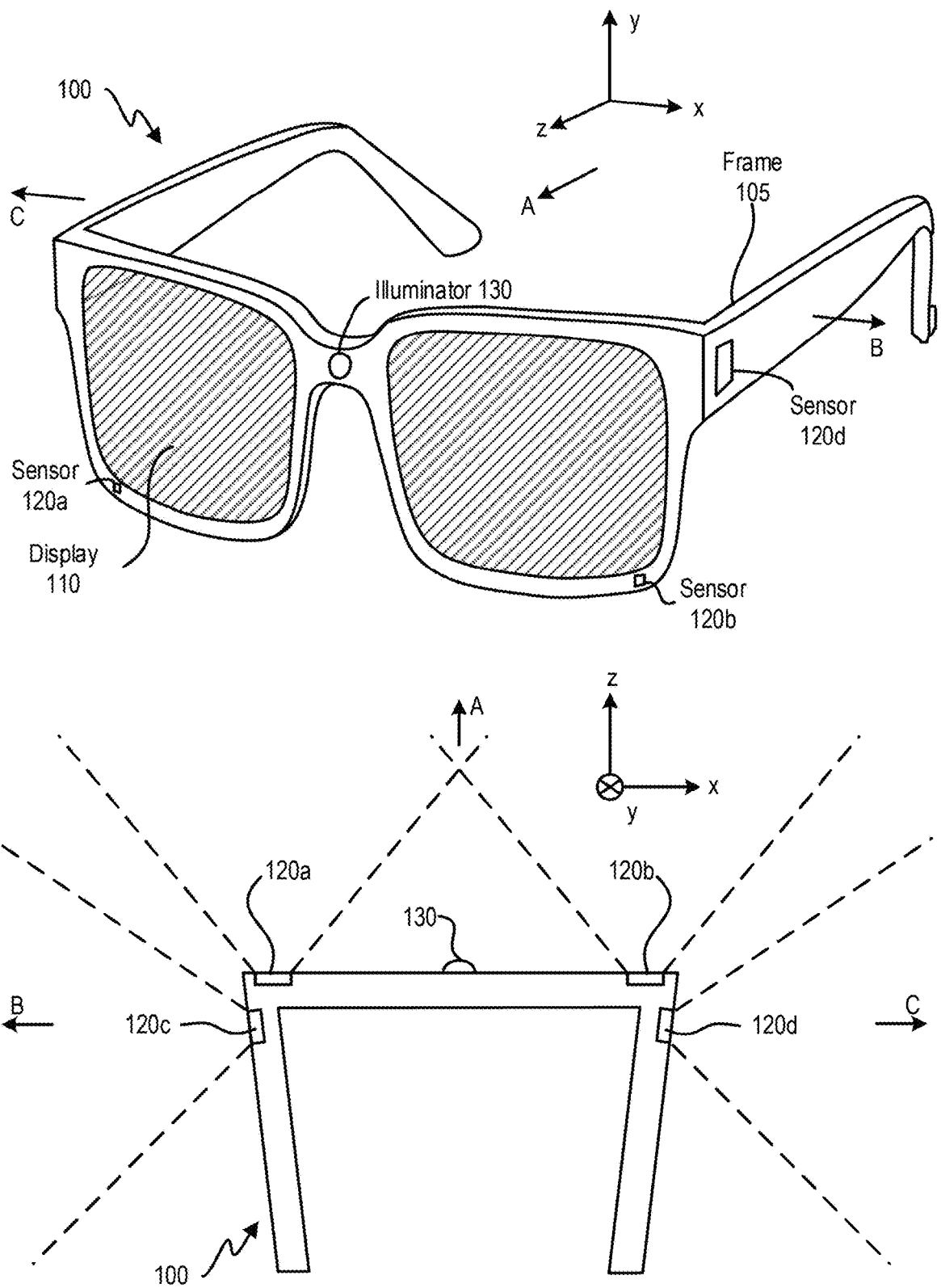
FIG. 1A and FIG. 1B are diagrams of an example of a near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Examples of the present disclosure provide a display apparatus. The display apparatus may include a plurality of light emitting diodes (LEDs), a display controller circuit, display driver circuits, and a test module. The display controller circuit may include a graphic pipeline and driver configuration circuits to generate display control signals to control output intensities of at least some of the plurality of LEDs to output an image. The test module is configured to generate test control signals to perform test and measurement operations with at least one LED of the plurality of LEDs. In some examples, the at least one LED is not involved in the outputting of images but may receive same display control signals as other LEDs involved in the outputting of images. In some examples, the at least one LED is involved in the outputting of images.

The display driver circuits are coupled with the plurality of LEDs. The display driver circuits may receive different controls signals from the display controller and from the test module, and provide different driving signals to the plurality of LEDs in different operation modes. For example, in a normal operation mode, the display driver circuits may receive the display control signals from the display controller, generate display driving signals based on the display control signals, and provide the display driving signals to the plurality of LEDs to enable at least some of the plurality of the LEDs to output the image. The display control signals may include, for example, pulse width modulation (PWM) signals from the graphic pipeline. The PWM signals may have pre-determined duty cycles to set durations of time when a current flows through the at least some of the plurality of LEDs. The display control signals may also include, for example, current setting voltages from the driver configuration circuits to set the currents that flow through the display driver circuits and the at least some of the plurality of LEDs, etc., to control intensities of light output by the LEDs. In a test operation mode, the display driver circuits may receive the test control signals from the test module, generate test driving signals based on the test control signals, and provide the test driving signals to the at least one LED to perform the test and measurement operations.

As part of the test and measurement operations, the test module can measure outputs from the at least one LED responsive to the test driving signals, and determine electrical characteristics of the at least one LED based on the outputs. An example of electrical characteristics may include a I-V curve of the at least one LED. The I-V curve of an LED can define a relationship between a voltage across the LED and a current that flows through the LED and induced by the voltage. To obtain the I-V curve of the at least one LED, the test module can provide, at different times, multiple sets of test control signals to the display driver circuits, which can then apply different voltages across the at least one LED at different times. The test module can measure the current that flows through the at least one LED for each of the different voltages, and obtain different current-voltage pairs. The different current-voltage pairs can be used to construct a I-V curve of the at least one LED.

The electrical characteristics information can be used to determine the display control signals for a target output intensity. For example, based on the I-V curve information, the display controller can determine the current setting voltage (to induce a target quantity of current) to achieve the target output intensity at the at least one LED. As another example, based on the I-V curve information, the display controller can also determine the duty cycles of the PWM signals to achieve the target output intensity. The test module may also compare the latest I-V curve against a I-V curve obtained at a prior time to determine a time-based difference in the voltage for the target current/target output intensity, and provide the difference to the display controller, which can adjust the display control signals based on the difference.

A display apparatus according to examples of the present disclosure can track a change in the electrical characteristics (e.g., the I-V curve) of the display LEDs with respect to time, and adjust the control signals to the display LEDs accordingly. Such arrangements can maintain the output characteristics (e.g., color, brightness, etc.) of the display apparatus even when the electrical characteristics of the display LEDs change with time due to, for example, the effects of electrical stress and aging. Moreover, compared with a case where the display apparatus predicts the change in the electrical characteristics of the display LEDs based on model data, a display apparatus according to examples of the present disclosure performs the actual measurement of the electrical characteristics of display LEDs (or LEDs that receive are subject to the similar level of aging and electrical stress as the display LEDs) at different times. Such arrangements allow more accurate characterization of the changes in the electrical characteristics with respect to time, and the adjustments in the control signal can become more aligned with the actual changes in the electrical characteristics of the display LEDs. All these can improve the performance of the display apparatus.

Examples of the disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some examples, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HIVID, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120*a*, 120*b*, 120*c*, and 120*d*. Each of image sensors 120*a*, 120*b*, 120*c*, and 120*d* may include a pixel array configured to generate image data representing different fields of views along different directions. For example, image sensors 120*a* and 120*b* may be configured to provide image data representing two field of views towards a direction A along the Z axis, whereas sensor 120*c* may be configured to provide image data representing a field of view towards a direction B along the X axis, and sensor 120*d* may be configured to provide image data representing a field of view towards a direction C along the X axis.

In some embodiments, sensors 120*a*-120*d* can be configured as input devices to control or influence the display content of the near-eye display 100, to provide an interactive VR/AR/MR experience to a user who wears near-eye display 100. For example, sensors 120*a*-120*d* can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120*a*-120*d* can provide the location tracking system a more holistic view of the physical environment, which can lead to more objects to be included in the construction and updating of the map. With such an arrangement, the accuracy and robustness of tracking a location of the user within the physical environment can be improved.

In some embodiments, near-eye display 100 may further include one or more active illuminators 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120*a*-120*d* in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120*a* or 120*b* can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the images of which can be captured by the IR pixel array. Based on a distribution of the IR markers of the object as shown in the image, the system can estimate a distance of different parts of the object from the IR pixel array, and generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120*a*-120*d* may need to have a wide dynamic range to be able to operate properly (e.g., to generate an output that correlates with the intensity of incident light) across a very wide range of light intensities associated with different operating environments for near-eye display 100.

Figure 1B:
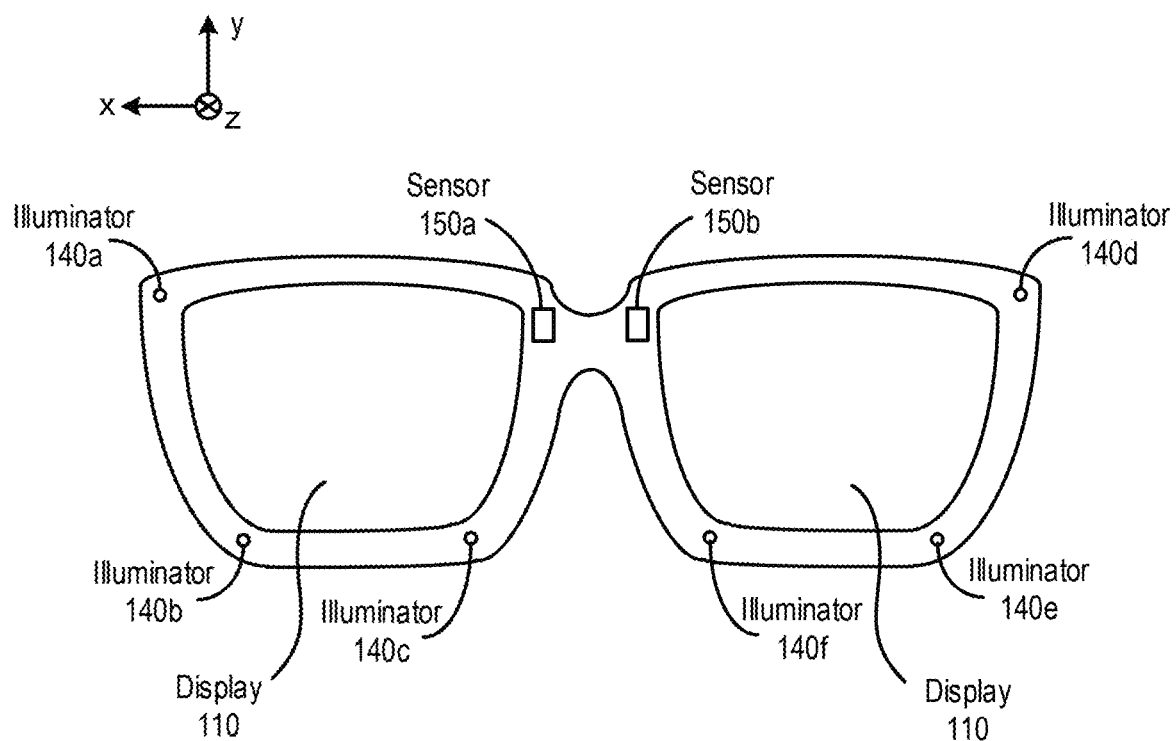

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140*a*, 140*b*, 140*c*, 140*d*, 140*e*, and 140*f*. Near-eye display 100 further includes a plurality of image sensors 150*a* and 150*b*. Illuminators 140*a*, 140*b*, and 140*c* may emit lights of certain frequency range (e.g., NIR) towards direction D (which is opposite to direction A of FIG. 1A). The emitted light may be associated with a certain pattern, and can be reflected by the left eyeball of the user. Sensor 150*a* may include a pixel array to receive the reflected light and generate an image of the reflected pattern. Similarly, illuminators 140*d*, 140*e*, and 140*f* may emit NIR lights carrying the pattern. The NIR lights can be reflected by the right eyeball of the user, and may be received by sensor 150*b*. Sensor 150*b* may also include a pixel array to generate an image of the reflected pattern. Based on the images of the reflected pattern from sensors 150*a* and 150*b*, the system can determine a gaze point of the user, and update the image data provided to display 100 based on the determined gaze point to provide an interactive experience to the user.

As discussed above, to avoid damaging the eyeballs of the user, illuminators 140*a*, 140*b*, 140*c*, 140*d*, 140*e*, and 140*f* are typically configured to output lights of very low intensities. In a case where image sensors 150*a* and 150*b* comprise the same sensor devices as image sensors 120*a*-120*d* of FIG. 1A, the image sensors 120*a*-120*d* may need to be able to generate an output that correlates with the intensity of incident light when the intensity of the incident light is very low, which may further increase the dynamic range requirement of the image sensors.

Moreover, the image sensors 120*a*-120*d* may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120*a*-120*d* need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 1B:
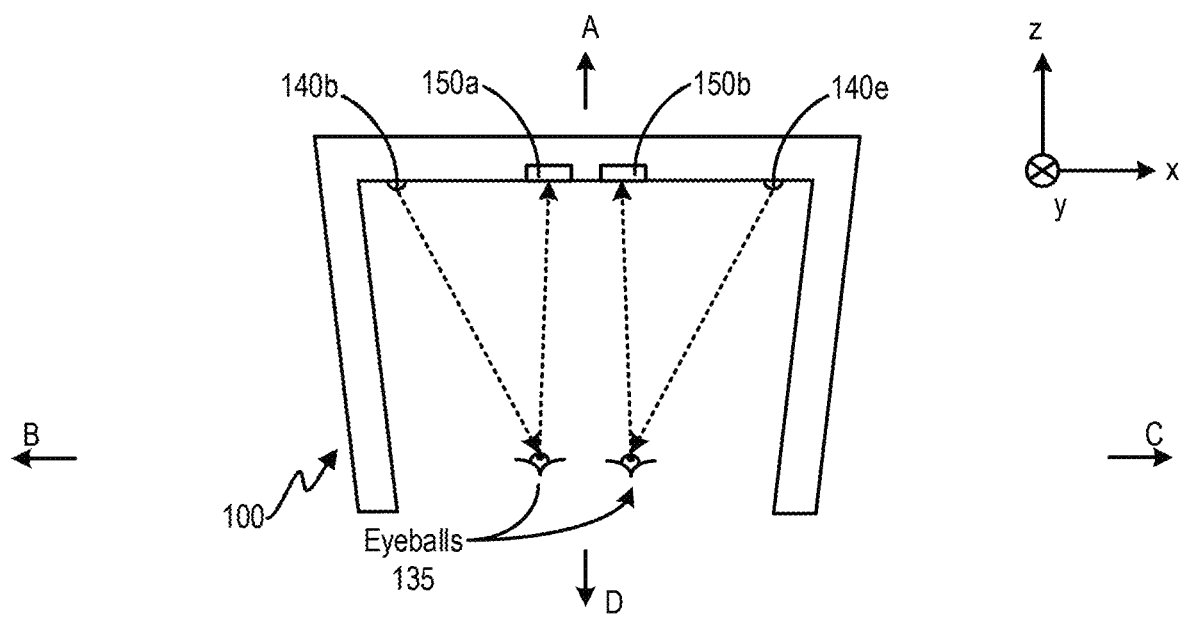
Figure 2:
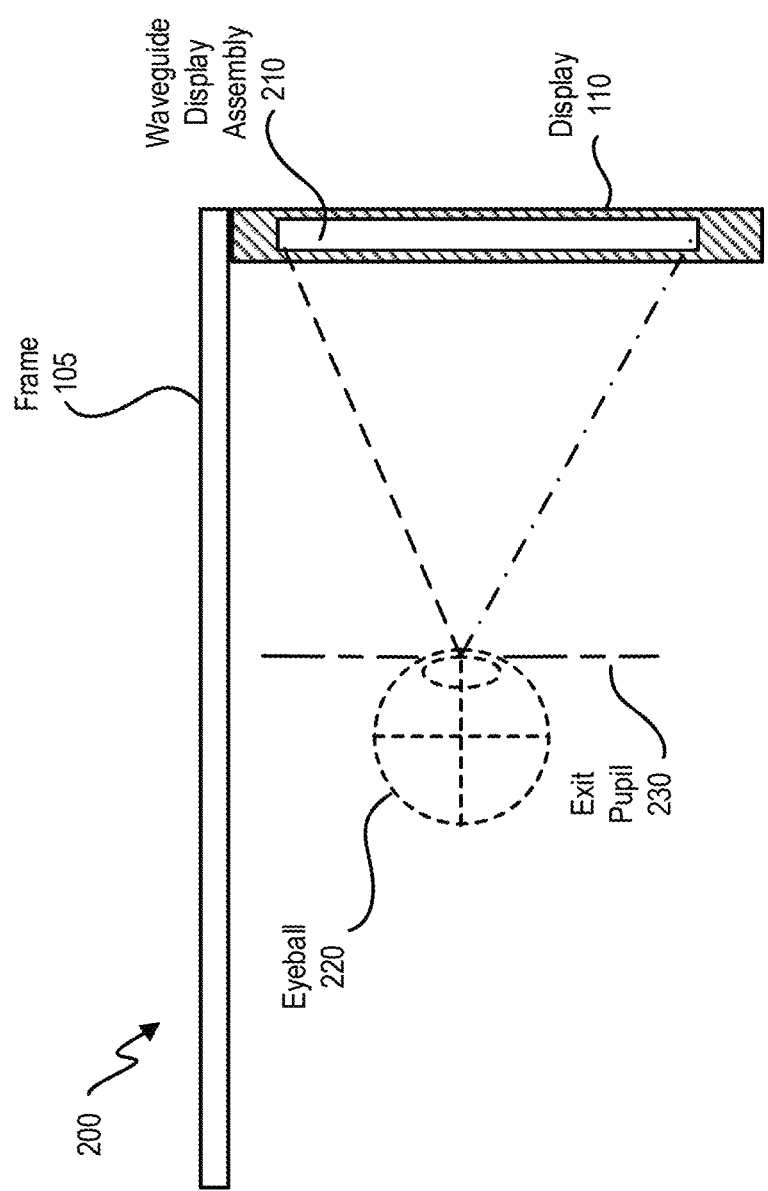
FIG. 2 is an example of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
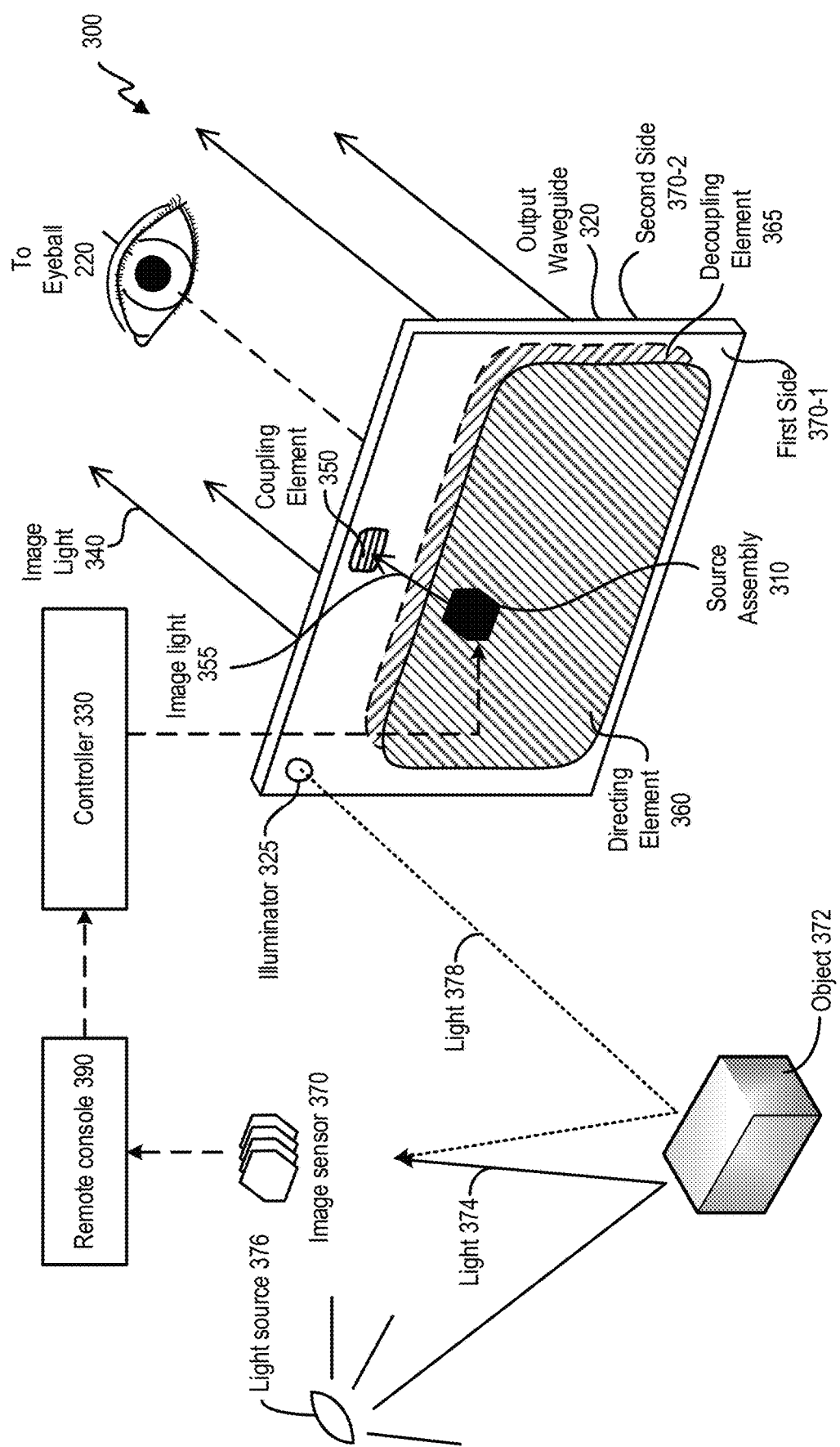
FIG. 3 illustrates an isometric view of an example of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, an illuminator 325, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. For example, controller 330 can determine scanning instructions for the source assembly 310. In some embodiments, the output waveguide 320 outputs expanded image light 340 to the user's eyeball 220 with a large field of view (FOV). For example, the expanded image light 340 is provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A. Image sensors 120a-120d can be operated to perform two-dimensional (2D) sensing and three-dimensional (3D) depth sensing of, for example, an object 372 in front of the user (e.g., facing first side 370-1). For 2D sensing, each pixel cell of image sensors 120a-120d can be operated to generate pixel data representing an intensity of light 374 generated by a light source 376 and reflected off object 372. For 3D depth sensing, each pixel cell of image sensors 120a-120d can be operated to generate pixel data based on light 378 generated by illuminator 325 and reflected off object 372. Image sensors 120a-120d can be operated to perform 2D and 3D sensing at different times, and provide the 2D and 3D image data to a remote console 390 that may be (or may be not) located within waveguide display 300. The remote console may combine the 2D and 3D images to, for example, generate a 3D model of the environment in which the user is located, to track a location and/or orientation of the user, etc. The remote console may determine the content of the images to be displayed to the user based on the information derived from the 2D and 3D images. The remote console can transmit instructions to controller 330 related to the determined content. Based on the instructions, controller 330 can control the generation and outputting of image light 355 by source assembly 310, to provide an interactive experience to the user.

Figure 4:
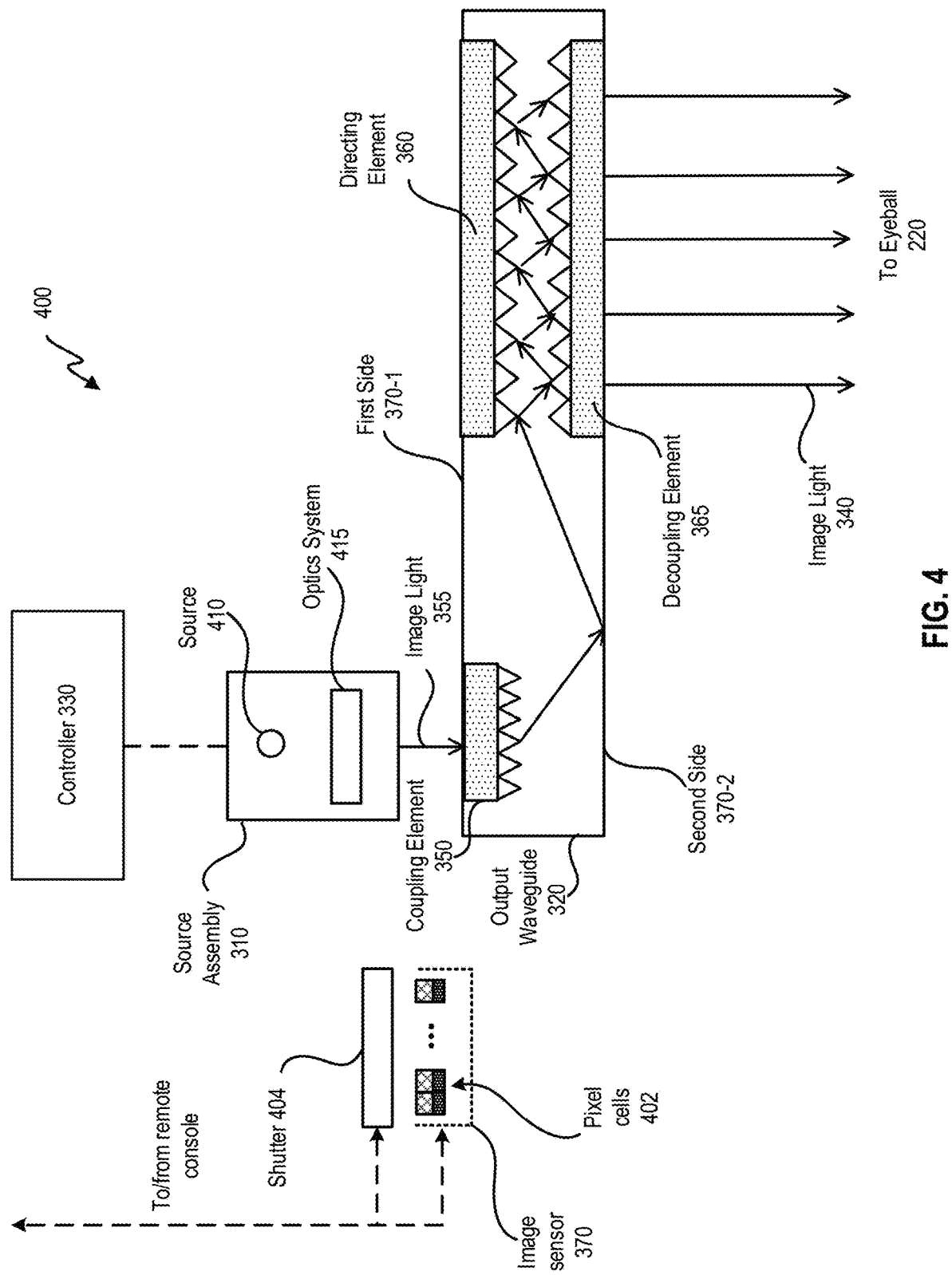
FIG. 4 illustrates a cross section of an example of the waveguide display.

FIG. 4 illustrates an embodiment of a cross section 400 of the waveguide display 300. The cross section 400 includes source assembly 310 and output waveguide 320. Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode. Optics system 415 includes one or more optical components that condition the light from source 410. Conditioning light from source 410 may include, e.g., expanding, collimating, and/or adjusting orientation in accordance with instructions from controller 330. The one or more optical components may include one or more lenses, liquid lenses, mirrors, apertures, and/or gratings. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is a diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
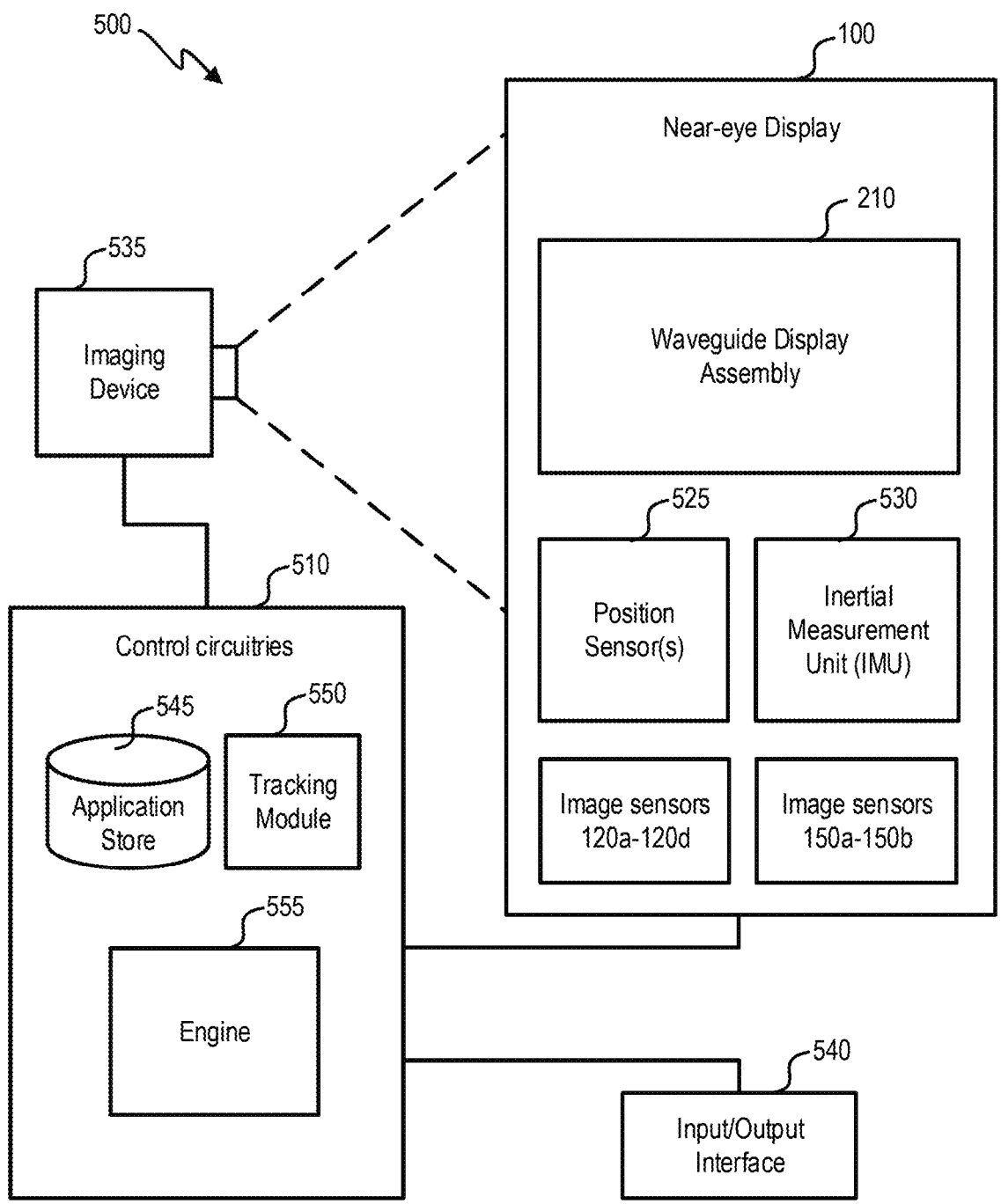
FIG. 5 is a block diagram of an example of a system including the near-eye display.

FIG. 5 is a block diagram of an embodiment of a system 500 including the near-eye display 100. The system 500 comprises control circuitries 510, an imaging device 535, and an input/output interface 540. Each of imaging device 535 and input/output interface 540 is coupled to control circuitries 510. System 500 can be configured as a head-mounted device, a wearable device, etc.

Imaging device 535 includes near-eye display 100, which is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 510 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound, etc.).

Near-eye display 100 includes waveguide display assembly 210, image sensors 120a-120d and 150a-150b, one or more position sensors 525, and/or an inertial measurement unit (IMU) 530. Waveguide display assembly 210 includes source assembly 310, output waveguide 320, and controller 330 as depicted in FIG. 3. IMU 530 is an electronic device that generates fast calibration data indicating an estimated position of near-eye display 100 relative to an initial position of near-eye display 100 based on measurement signals received from one or more of position sensors 525. The estimation of the position of near-eye display 100 can also be based on or augmented by image data from image sensors 120a-120d of FIG. 1A, which can generate image data of a physical environment in which the user (and near-eye display 100) is located. For example, as described above, image sensors 120a-120d can be operated to perform 2D and 3D sensing of an environment at different times. The 2D and 3D image data of the environment can be processed by control circuitries 510 to determine, for example, the estimated position of near-eye display 100.

The input/output interface 540 is a device that allows a user to send action requests to the control circuitries 510. An action request is a request to perform a particular action. For example, an action request may be to start or end an application or to perform a particular action within the application.

Control circuitries 510 provides media to near-eye display 100 for presentation to the user in accordance with information received from one or more of: imaging device 535, near-eye display 100, and input/output interface 540. In some examples, control circuitries 510 can be housed within system 500 configured as a head-mounted device. In some examples, control circuitries 510 can be a standalone console device communicatively coupled with other components of system 500. In the example shown in FIG. 5, control circuitries 510 include an application store 545, a tracking module 550, and an engine 555.

Application store 545 stores one or more applications for execution by the control circuitries 510. An application is a group of instructions, that, when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100. Moreover, tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535), etc.

Figure 6A:
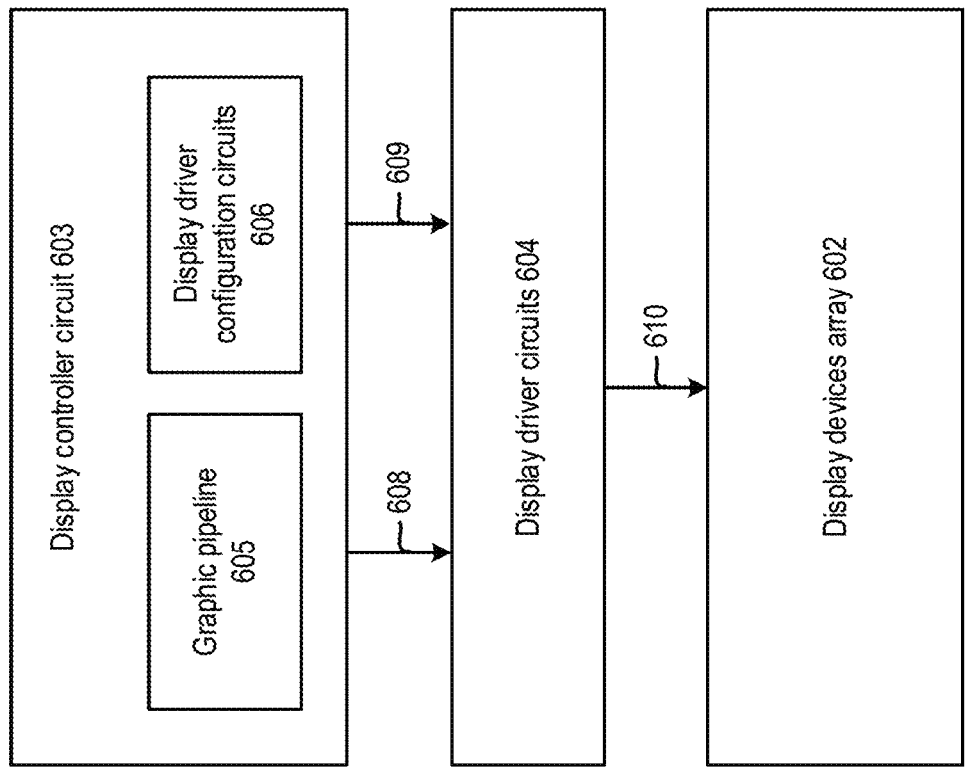
FIG. 6A, FIG. 6B, and FIG. 6C illustrate an example of a display apparatus for which the disclosed techniques can be used.
Figure 6B:
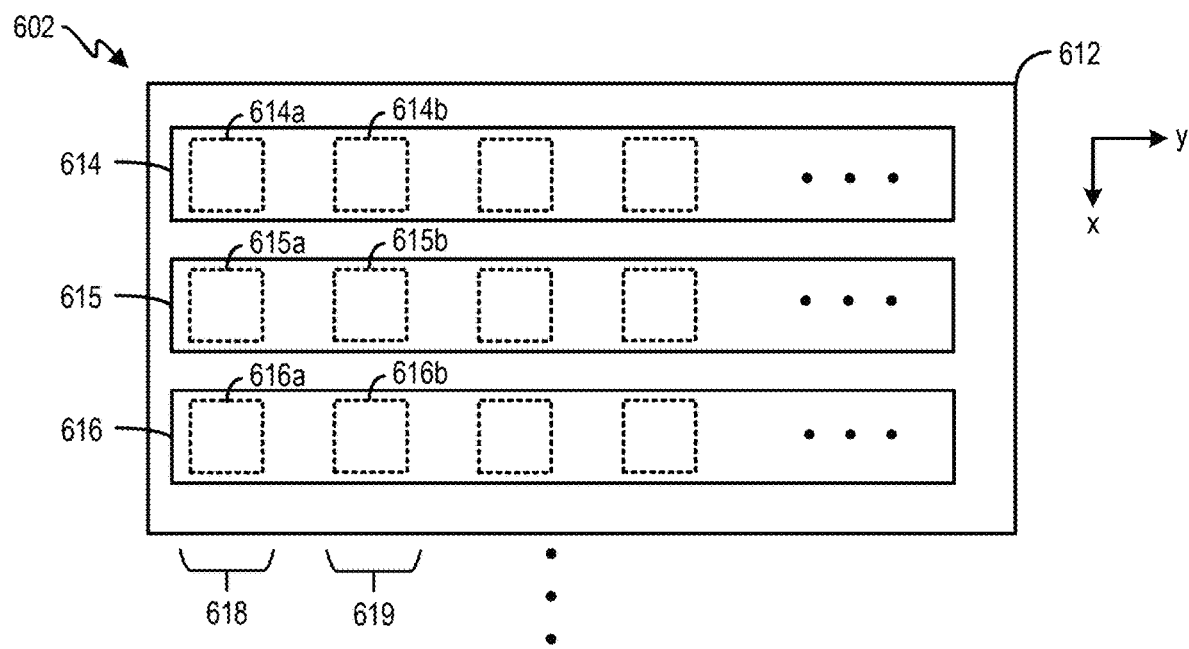
Figure 6C:
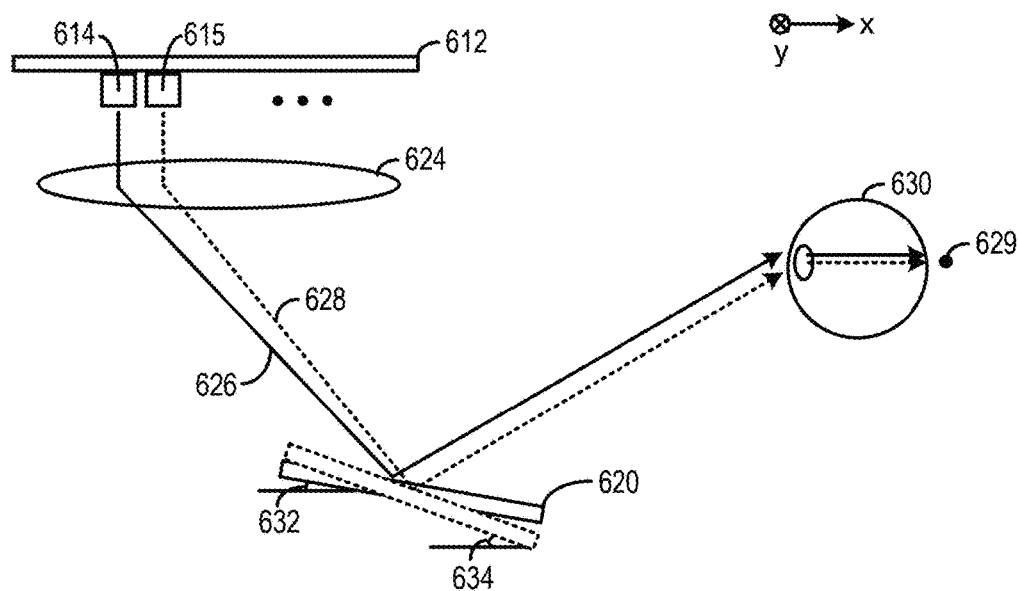

As described above, near-eye display 100 may include a display 110 to display images to present certain content to the user. FIG. 6A-FIG. 6C illustrate examples of components of display 110. In one example, as shown in FIG. 6A, display 110 may include a display devices array 602, a display controller circuit 603, and display driver circuits 604. Display devices array 602 may include an array of individually-controllable display devices. Each of the display devices can be configured to output visible light of pre-determined wavelength ranges (e.g., corresponding to one of red, green, or blue) at a pre-determined intensity. A group of display devices that output red, green, and blue lights can have their output lights combined to form a pixel, with the color of each pixel determined based on the relative intensities of the red, green, and blue lights (or lights of other colors) output by the display devices within the group. Groups of display devices of display devices array 602 can be individually controlled to output light of different intensities to output an image comprising an array of pixels.

Display controller circuit 606 can include graphic pipeline 605 and display driver configuration circuits 606, which can generate, respectively, display control signals 608 and 609 to control display devices array 602 to output an image. Graphic pipeline 605 can receive instructions/data from, for example, control circuitries 510 of FIG. 5 to generate digital pixel data for an image to be output by display devices array 602. Graphic pipeline 605 can also map the pixels of the images to the groups of display devices of display devices array 602 and generate display control signals 608 based on the mapping and the pixel data. For example, for a pixel having a target color in the image, graphic pipeline 605 can identify the group of display devices of display devices array 602 corresponding that pixel, and generate display control signals 608 targeted at the group of display devices. The display control signals 608 can be configured to scale a baseline output intensity of each display devices within the group to set the relative output intensities of the display devices within the group, such that the combined output light from the group can have the target color. In addition, display driver configuration circuits 606 can control the baseline output intensity of the display devices of display devices array 602, to set the brightness of output of display devices array 602. Display driver circuits 604 can generate display driving signals 610 based on display control signals 608 and 609 for each display device of display devices array 602, and apply the display driving signals 610 to the display devices to output the image.

FIG. 6B and FIG. 6C illustrate example operations of display devices array 602 to output an image frame. As shown in FIG. 6B, display devices array 602 can include display devices arranged in rows on a backplane 612 to form rows of display devices 614, 615, and 616. Each row can be parallel with the y-axis. Each of rows of display devices 614, 615, and 616 may be configured to output visible light of different wavelength ranges. For example, row of display devices 614 may be configured to output red light, row of display devices 615 may be configured to output green light, and row of display devices 616 of display devices may be configured to output blue light. Groups of display devices from each row can correspond to a pixel in an image. For example, the output light of display devices 614a, 615a, and 616b can be combined to form a pixel 618 in an image, whereas display devices 614b, 615b, and 616b can form a pixel 619 in the image. The output intensities of the display devices within each group corresponding to a pixel can be individually controlled to control the color and brightness of the pixel to display certain content in the image. For example, each display device of a pixel can have a baseline output intensity controlled by display driver configuration circuits 606 to achieve a certain brightness level for the pixel, and the baseline output intensities can be scaled by graphic pipeline 605 to achieve a target color for the pixel.

There are different ways to combine the output light of the display devices to form pixels of an image. In one example, display 110 can be configured as a scanning display comprising display devices array 602 (arranged on backplane 612), a mirror 620, and a lens 624. Row of display devices 614 may output red light 626, whereas row of display devices 615 may output green light 628. Both red light 626 and green light 628 can correspond to the red and green components of a first line of pixels 629 (along the y axis) of an image, and the intensities of red light 626 and green light 628 can be controlled by display controller circuit 606 and display driver circuits 604 based on the pixel data of the image. The lights can be converged by lens 624 and reflected by mirror 620 into eyeball 630 of a person. As part of sequential scanning, mirror 620 can be rotated, sequentially, to form a set of angles with respect to lens 624 (and/or with respect to the x-y plane) to reflect light from different rows of display devices into eyeball 630 to form an image. For example, at a first time, mirror 620 can form a first angle 632 with lens 624 (or with respect to the x-y plane) to reflect red light 626 into eyeball 630. Mirror 620 can then be rotated to form a second angle 634 with lens 624, at a second time, to reflect green light 628 into eyeball 630. Due to a finite perception delay of a human being, red light 626 and green light 628 may be perceived as arriving at the same time to combine and form line of pixels 629 at the retina. Mirror 620 can be rotated to form other angles with lens 624 to reflect light from other rows of display devices (not shown in FIG. 6C) into eyeball 630 for other lines of pixels of the image. After mirror 620 reflects the light of the last row of display devices, it can be rotated back to form first angle 632 to start the sequential scanning for the next image.

In some examples, the display devices configured to output different colors of light can also be arranged within the same rows in display devices array 602 in an arrangement similar to a color filter array (e.g., a Bayer filter). The display devices can be configured to project the different colors of light simultaneously into the retina of eyeball 630, which can combine the colors to form the perception of pixels for an image.

Various types of display devices can be used to form display devices array 602 including, for example, a light emitting diode (LED). There are different types LEDs including, for example, Organic Light Emitting Diode (OLED), Active Matrix Organic Light Emitting Diode (AMOLED), Inorganic Light Emitting Diodes (ILEDs), etc. Inorganic Light Emitting Diodes (ILEDs) are emerging as the third generation of flat display image generators based on superior battery performance and enhanced brightness. A "µLED," or "MicroLED," described herein refers to a particular type of ILED having a small active light emitting area (e.g., less than 2,000 µm$^2$) and, in some examples, being capable of generating directional light to increase the brightness level of light emitted from the small active light emitting area.

Figure 7A:
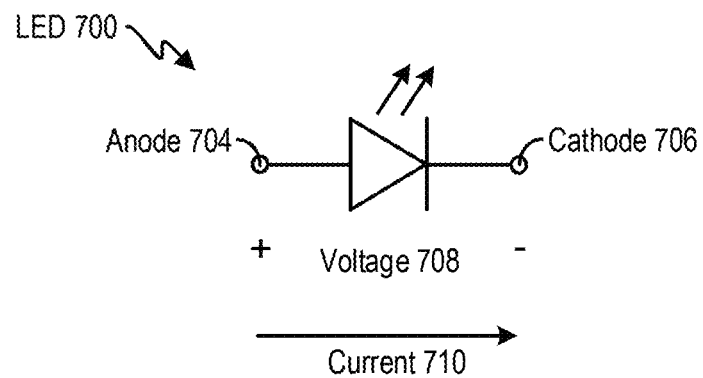
FIG. 7A and FIG. 7B illustrate an example of a display device of the display apparatus of FIG. 6A-FIG. 6C and its electrical characteristics.
Figure 7A:
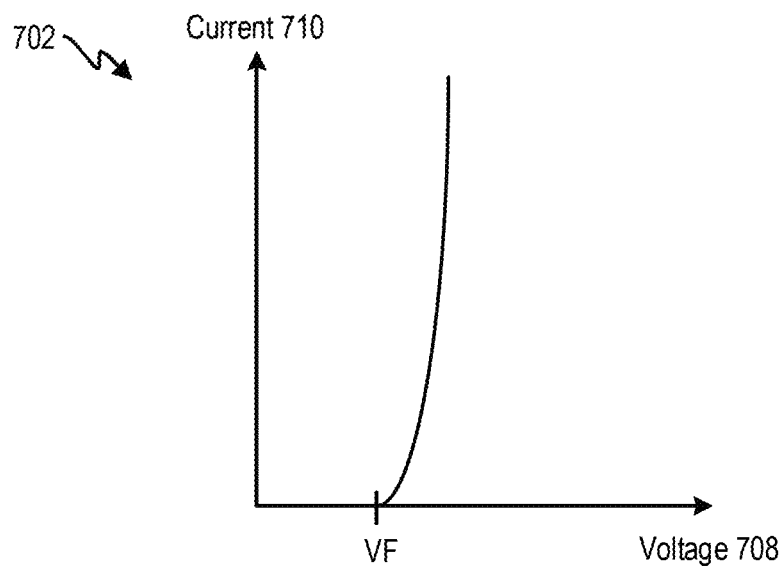

FIG. 7A illustrates an example of an LED 700 and a graph 702 representing the electrical characteristics of LED 700. LED 700 can be configured as a display device in display devices array 602. LED 700 may include an anode 704 and a cathode 706. Referring to graph 702, which provides an example I-V curve of LED 700, when a positive forward bias voltage 708 (hereinafter, "voltage 708") below a voltage threshold VF is applied across anode 642 and cathode 644, a zero or otherwise negligible current 710 may flow through LED 700. When positive forward bias voltage 708 reaches or exceeds the voltage threshold VF, LED 700 may become forward biased, and a forward bias current 710 (herein after, "current 710"), which is a forward bias current, may flow from the anode 642 to cathode 644. The flow of current 710 can lead to recombination of charges within LED 700, which can lead to light emission. Beyond voltage threshold VF, current 710 may increase exponentially with respect to an increase in positive forward bias voltage. The output intensity of LED 700 can be proportional to current 710 and may also increase exponentially with positive forward bias voltage 708.

Figure 7B:
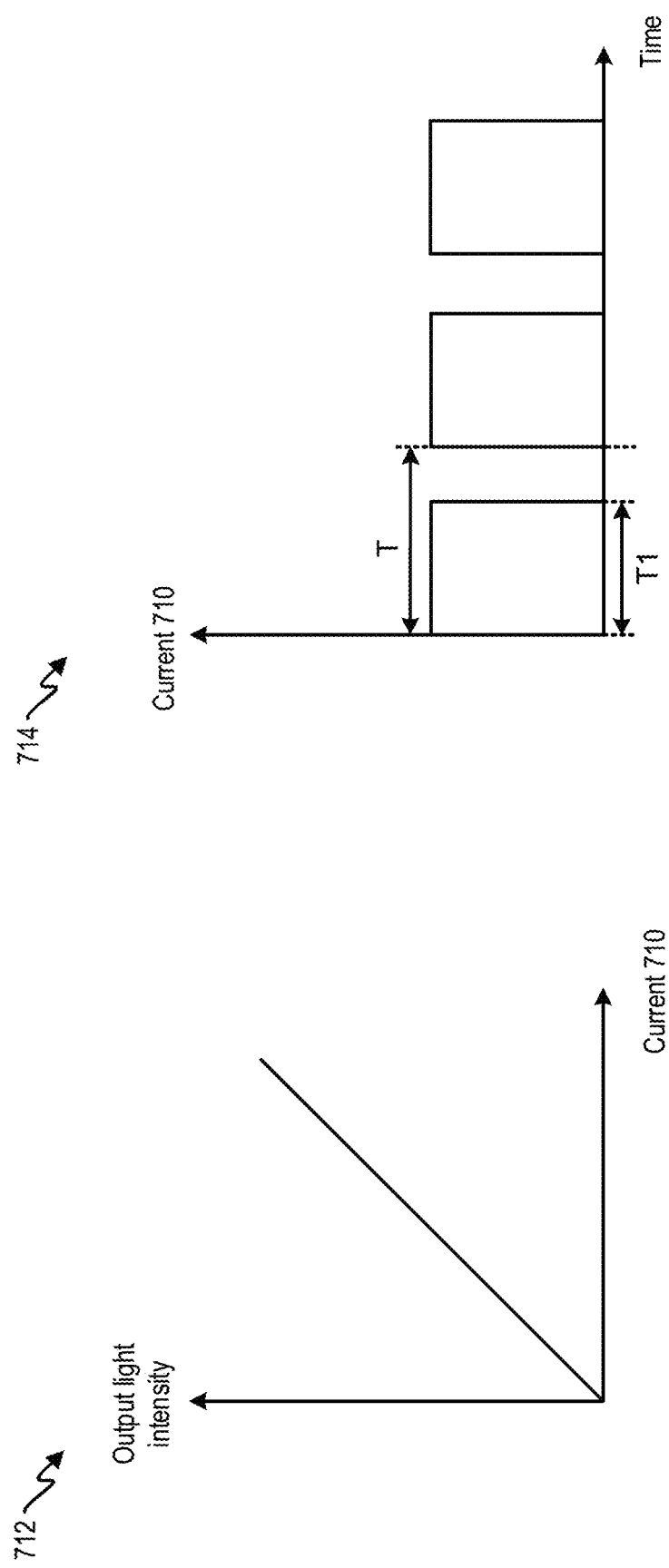

FIG. 7B illustrates examples of techniques to adjust the output intensity of LED 700. Graph 712 on the left illustrates an example of current-intensity characteristics of LED 700. As shown in graph 712, the output intensity of LED 700 is proportional to current 710, and the output intensity can be adjusted by adjusting current 710. Current 710 can be adjusted by adjusting forward bias voltage 708 based on the I-V curve of LED 700 as shown in graph 702 of FIG. 6D. Such arrangements may be used to set a baseline output intensity of LED 700, but may be unsuitable for fine-grain adjustment of the output intensity (e.g., to achieve a target color based on setting the relative output intensities of a group of LEDs for a pixel). This is because current 710 increases exponentially with forward bias voltage 708, and a small increase in forward bias voltage 708 can lead to substantial increase in current 710, which limits the resolution of adjustment of the output intensity.

Graph 714 on the right of FIG. 7B illustrates another example technique to adjust the output intensity of LED 700. As shown in graph 714, the supply of current 710 to LED 700 can be pulsed. For example, current 710 can be pulsed by, for example, supplying forward bias voltage 708 in the form of a pulse width modulation (PWM) signal with a period T having an on-time period T1. With such arrangements, current 710 is supplied to LED 700 for the time duration of T1 within each period T, and current 710 is not supplied to LED 700 for the remainder of each period. If period T is very short, due to finite perception delay, a human observer may perceive the output intensity of LED 700 as an average output intensity within period T. The length of time duration of T1 can determine the perceived output intensity of LED 700. By adjusting the length of time duration of T1, the perceived output intensity of LED 700 can be adjusted even if the magnitude of current 710 (supplied to LED 700 during time T1) is kept constant across different periods T.

Figure 8A:
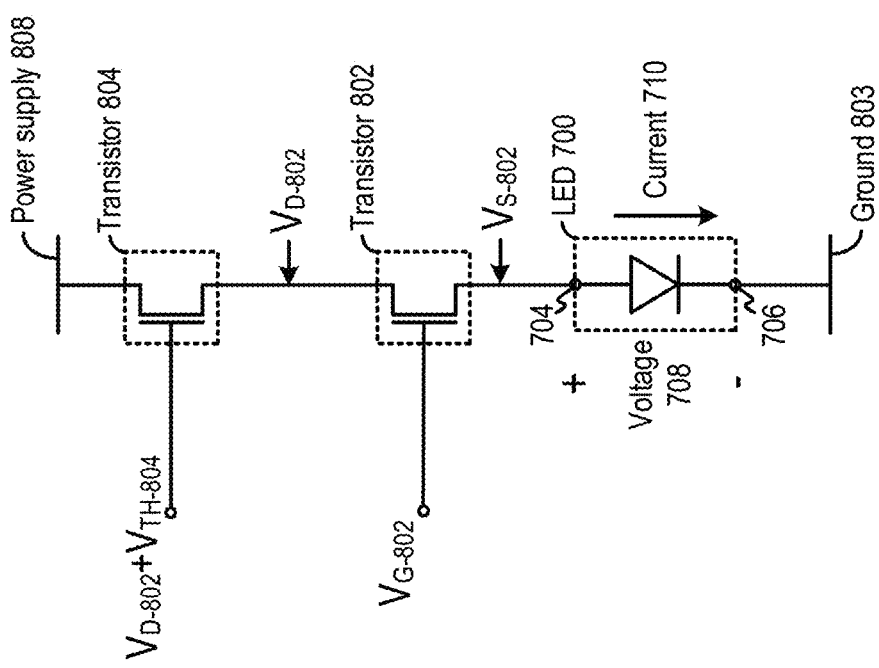
FIG. 8A, FIG. 8B, and FIG. 8C, illustrate examples of an LED driver circuit and its operations according to the disclosed techniques.
Figure 8B:
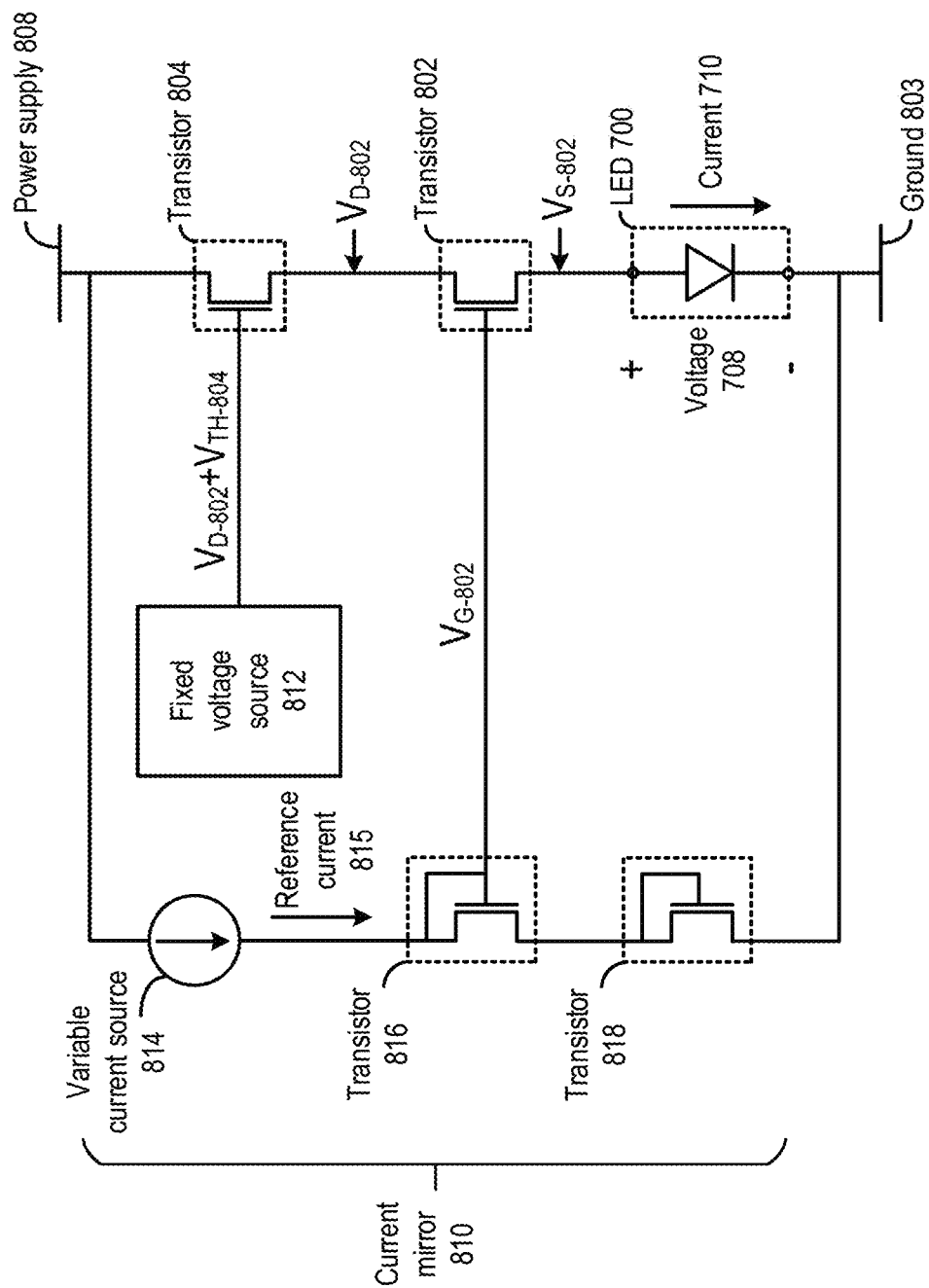
Figure 8C:
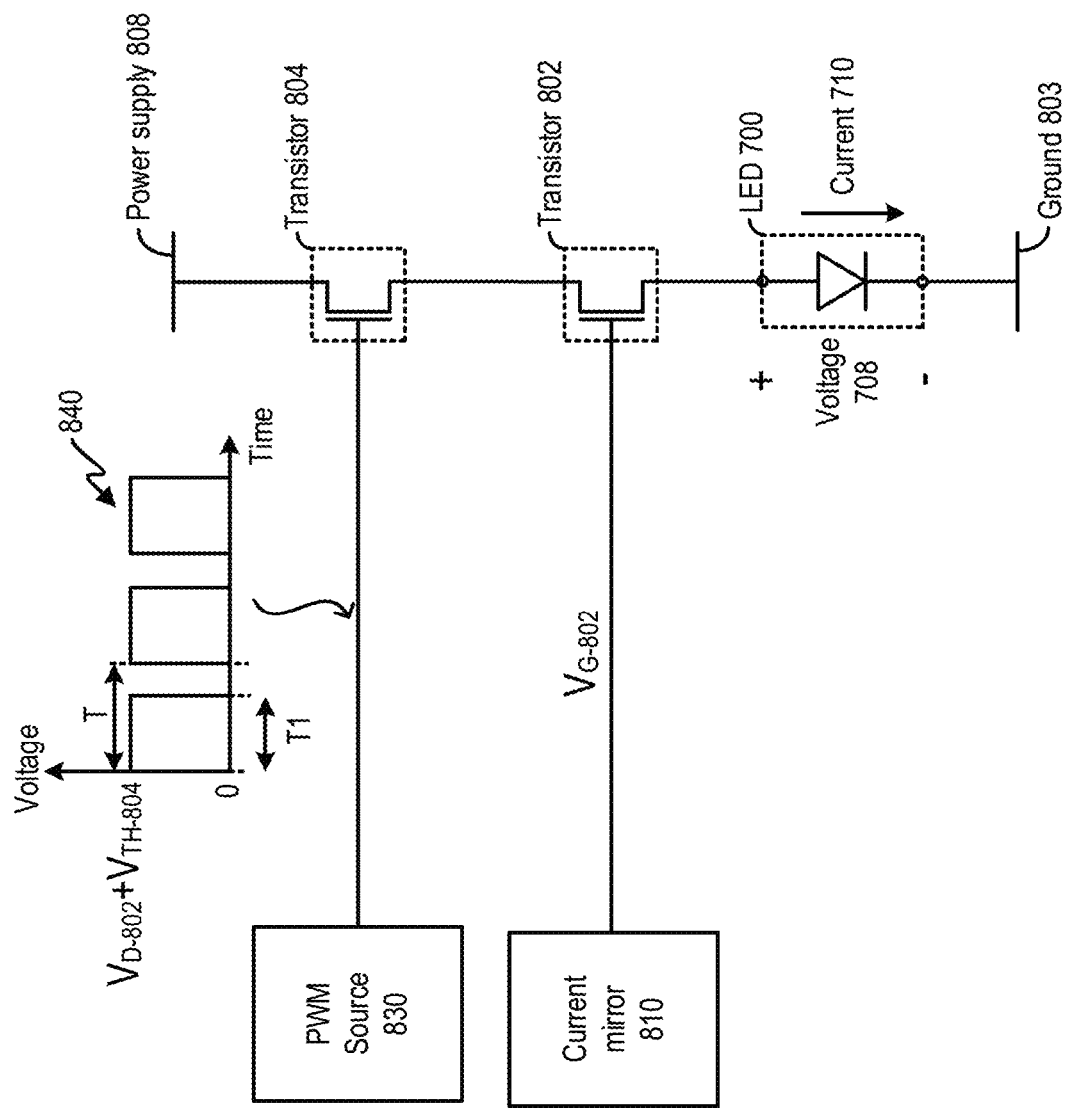

FIG. 8A illustrate an example of an LED driver circuit 800 which can be used to drive an LED (e.g., LED 700 of FIG. 7A) to generate light, whereas FIG. 8B and FIG. 8C illustrate examples of configurations of LED driver circuit 800. A plurality of LED driver circuits 800 can be included in display driver circuits 604, with each LED driver circuit 800 configured to generate display driving signals 610 for an LED display device of display devices array 602, to allow each LED display device to be controlled individually.

As shown in FIG. 8A, LED driver circuit 800 may include a transistor 802 and a transistor 804. Both transistors 802 and 804 can be N-type transistors including, for example, N-type metal-oxide-semiconductor field-effect transistor (MOSFET) transistors. It is understood that transistors 802 and 804 can also be P-type transistors. Transistor 802 can be configured as a current driver for LED 700, with the source terminal of transistor 802 connected to anode 704 of LED 700, while cathode 706 of LED 700 can be connected to a current sink (e.g., ground 803). The gate terminal of transistor 802 can receive a gate voltage (denoted as "$V_{G\text{-}802}$") which can control the current that flows through transistor 802 as well as LED 700 by setting the source terminal voltage of transistor 802 (denoted as "$V_{S\text{-}802}$"). The source terminal voltage in turn can determine forward bias voltage 708 across anode 704 and cathode 706 of LED 700 and the current through LED 700. For example, assuming that transistor 802 operates in the saturation mode, a relationship between $V_{G\text{-}802}$ and $V_{S\text{-}802}$ can be defined as follows:

$$\tfrac{1}{2}K(V_{G\text{-}802}-V_{S\text{-}802}-V_{TH\text{-}802})^2 = f(V_{s\text{-}802}) \quad \text{(Equation 1)}$$

In Equation 1, K is a parameter related to the carrier mobility, capacitance, and dimension of transistor 802, whereas $V_{TH\text{-}802}$ is the threshold voltage of transistor 802. The expression on the left of the equation can define the current that flows through transistor 802 based on the values of $V_{G\text{-}802}$ and $V_{S\text{-}802}$. The expression on the right is a function f that represents the I-V characteristics of LED 700 and provides a value of the current 710 that flows through LED 700 with the particular value of $V_{S\text{-}802}$, which also sets forward bias voltage 708. With the current that flows through transistor 802 equal to current 710, the gate voltage $V_{G\text{-}802}$ can be a current setting signal to set the source voltage $V_{S\text{-}802}$ as well as current 710, to control the output intensity of LED 700. In some examples, source voltage $V_{S\text{-}802}$ can be part of display driving signals 610 of FIG. 6A.

In addition, transistor 804 can be configured as a voltage buffer to set the drain terminal voltage of transistor 802 (denoted as $V_{D\text{-}802}$). The drain terminal voltage of transistor 802 can be set to be higher than an overdrive voltage of transistor 802 (which equals to $V_{G\text{-}802} - V_{S\text{-}802} - V_{TH\text{- }802}$) to ensure that transistor 802 is in saturation mode. For example, the gate terminal voltage of transistor 804 can be $V_{D\text{-}802} + V_{TH\text{-}804}$, where $V_{TH\text{-}804}$ is the threshold voltage of transistor 804. Transistor 802 can also provide a connection between transistor 802 and a power supply 808 that supplies current (e.g., a voltage regulator) to transistor 802 and LED 700. As to be described below, transistor 802 can also operate as a switch to enable or disable supply of current 710 to LED 700 to control the perceived output intensity of LED 700.

FIG. 8B illustrates one example configuration of LED driver circuit 800. In FIG. 8B, the gate terminal of transistor 802 can be driven by a current mirror 810 to set current 710 based on a reference current in current mirror 810, whereas the gate terminal of transistor 804 can be driven by a fixed voltage source 812 that supplies a fixed voltage $V_{D\text{-}802} + V_{TH\text{-}804}$. As shown in FIG. 8B, current mirror 810 comprises a variable current source 814 which supplies a reference current 815, and diode-connected transistors 816 and 818. Diode-connected transistors 816 and 818 can be N-type transistors and each has its gate and drain terminals shorted together to form diodes. Variable current source 814 can be connected to the drain/gate terminals of diode-connected transistor 816, whereas the source terminal of diode-connected transistor 816 is connected to the gate/drain terminal of transistor 818. Transistor 816 can be matched with transistor 802 (e.g., having the same parameter K in Equation 1), whereas transistor 818 can have similar I-V characteristics as LED 700. When reference current 815 flow through transistor 816 and transistor 818, a gate voltage $V_{G\text{-}802}$ is developed at the gate/drain terminals of transistor 814 as well as the gate terminal of transistor 802, while the source terminal voltage of transistor 816 can be similar to the source terminal voltage of transistor 802 when current 710 starts to flow. With transistors 802 and 816 matched and having approximately the same gate and source terminal voltages, transistor 802 can conduct a current 710 that approximately matches reference current 815. Current 710 can be adjusted based on, for example, configuring variable current source 814 to adjust reference current 815. In some examples, current mirror 810 can be part of display driver configuration circuits 606 and can be controlled based on the pixel data information from graphic pipeline 605. For example, display driver configuration circuits 606 may maintain a mapping table that maps different values of reference current 815 to different values of current 710 and the associated output intensities. Based on the pixel data, display driver configuration circuits 606 can determine the target output intensity and the corresponding value of reference current 815, and adjust variable current source 814 accordingly. The gate voltage $V_{G-802}$ output of current mirror 810 can be part of display control signals 609.

In the example configuration of FIG. 8B, LED driver circuit 800 can be used as an analog LED driver to adjust the output intensity of LED 700, and the color/brightness of a pixel, based on adjusting current 710 using current mirror 810. For example, based on pre-determined current-intensity characteristics of LED 700 (e.g., similar to graph 712 of FIG. 7B), a target current 710 to achieve a target output intensity can be determined. Further, based on pre-determined I-V characteristics of LED 700 (e.g., similar to graph 702 of FIG. 7A), the source terminal voltage of transistor 802 $V_{S-802}$ (which sets the bias voltage 708) to achieve a target current 710 can be determined. The requisite gate voltage for transistor 802 $V_{G-802}$ to conduct the target current 710 can also be determined. The reference current 815 can be set (e.g., based on configuring variable current source 814) at current mirror 810 to set the target current 710 and the associated target output intensity at LED 700. A group of LED 700 of different output colors can form a pixel, with each LED 700 within the group being driven by a separate LED driver circuit 800. Each LED driver circuit 800 can set a different current 710 for each LED 700 (based on display control signals 609 from display driver configuration circuits 606) to change the output intensities of the LEDs within the group, to set the output color as well as the brightness of the pixel.

FIG. 8C illustrates another example configuration of LED driver circuit 800. In FIG. 8C, the gate terminal of transistor 802 can be connected to current mirror 810 as described in FIG. 8B. The gate terminal of transistor 804 can be connected to a PWM source 830. PWM source 830 can drive the gate terminal of transistor 804 with a train of voltage pulses 840 with a period T and on-time T1 within each period. Train of voltage pulses 840 can toggle between a low voltage to switch off transistor 804 (e.g., 0v) and $V_{D-802}+V_{TH-804}$, to switch on/off transistor 804. When transistor 804 is turned on, a current 710 set by current mirror 810 can flow through LED 700 to generate output light. When transistor 804 is turned off, no current flow through LED 700, and LED 700 does not output light. In some examples, PWM source 830 can be part of graphic pipeline 605, and train of voltage pulses 840 can be part of display control signals 608. For example, graphic pipeline 605 may maintain a mapping table that maps different values of on-time T1 (or duty cycle) to different target perceived output intensities. Based on the pixel data, display driver configuration circuits 606 can determine the target perceived output intensity and the corresponding value of on-time T1, and adjust PWM source 830 accordingly.

In the example configuration of FIG. 8C, LED driver circuit 800 can be used as a digital LED driver to adjust the output intensity of LED 700, and the color/brightness of a pixel, based on adjusting the on-time T1. As described above with respect to FIG. 7B, the on-time T1 can be adjusted to set a perceived output intensity of LED 700. A shorter on-time T1 can lead to a reduced perceived output intensity of LED 700, whereas a longer on-time T1 can lead to an increased perceived output intensity of LED 700. Based on pre-determined I-V characteristics of LED 700, a baseline current 710 that flows through LED 700 for a particular setting of reference current 815 in current mirror 810 can be determined. Moreover, based on pre-determined current-intensity characteristics of LED 700, an expected output intensity of LED 700 corresponding to the baseline current 710 can also be determined. The on-time T1 can be set (e.g., based on configuring PWM source 830) based on the expected output intensity to set a target perceived output intensity. A group of LED 700 of different output colors can form a pixel, with each LED 700 within the group being driven by a separate LED driver circuit 800. Each LED driver circuit 800 can set different on-time T1 for each LED 700 to change the perceived output intensities of the LEDs within the group to set the perceived output color as well as the perceived brightness of the pixel.

In some examples, the LED driver circuit 800 having the configuration of FIG. 8C can also be used as a hybrid LED driver to adjust the output intensity of LED 700, and the color/brightness of a pixel, based on adjusting both on-time T1 as well as current 710. For example, for a group of LED 700 of different output colors forming a pixel, each LED driver circuit 800 can set different on-time T1 as well as different current 710 to change the perceived output intensities of the LEDs within the group to set the perceived output color as well as the perceived brightness of the pixel.

Figure 9A:
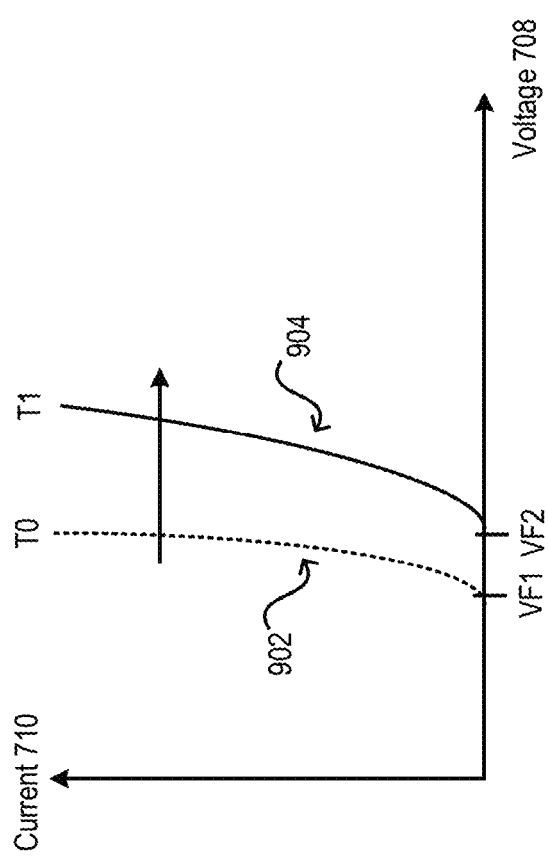
FIG. 9A and FIG. 9B illustrate examples of display device characteristics variations that can be addressed by the disclosed techniques.

As described above, the intensity control of an LED can be based on pre-determined I-V characteristics as well as pre-determined current-intensity characteristics of the LED. But these characteristics may vary with time and/or become non-uniform among different LEDs, which can lead to deviations of the output intensities from their expected values. FIG. 9A illustrates an example of I-V characteristics variation of LED 700. As shown in FIG. 9A, LED 700 may have a set of I-V characteristics defined by I-V curve 902 at time T0, and a set of I-V characteristics defined by I-V curve 904 at time T1 after time T0. The change in the I-V characteristics of LED 700 can be due to effect of electrical stress and aging caused by, for example, high-frequency switching of current 710 (e.g., by PWM source 830), conduction of large quantity of current 710, etc. As a result of the change in the I-V characteristics, the threshold voltage VF may increase (e.g., from VF1 to VF2), and the rate at which current 710 increases with bias voltage 708 may also reduce. As a result, display control signals configured based on I-V curve 902 may not achieve the target output intensity. For example, a bias voltage 708 falling between VF1 and VF2 may be insufficient to turn on LED 700 at time T1, but could have been able to induced certain quantity of current 710 to flow in LED 700 at time T0.

Figure 9B:
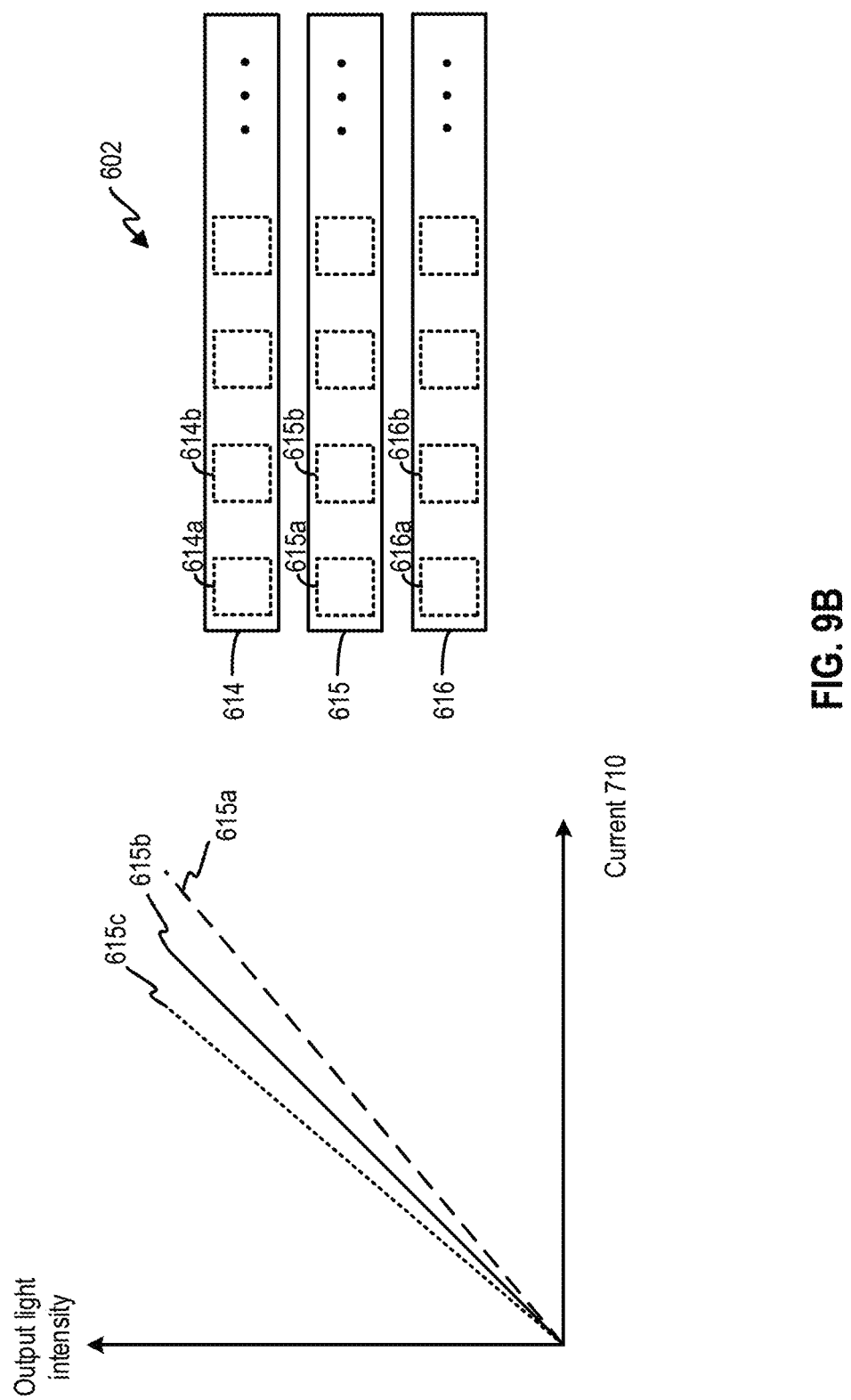

In addition, the I-V characteristics as well as the current-intensity characteristics of each LED within display devices array 602 may also vary due to variations in the fabrication of the LED devices. For example, as shown in FIG. 9B, the current-intensity characteristics of display device 615a, 615b, and 616b (all of which can include LED 700) may be different. As a result, even though each of display device 615a, 615b, and 616b is supplied with the same current 710, the display devices can have different output intensities.

Figure 10A:
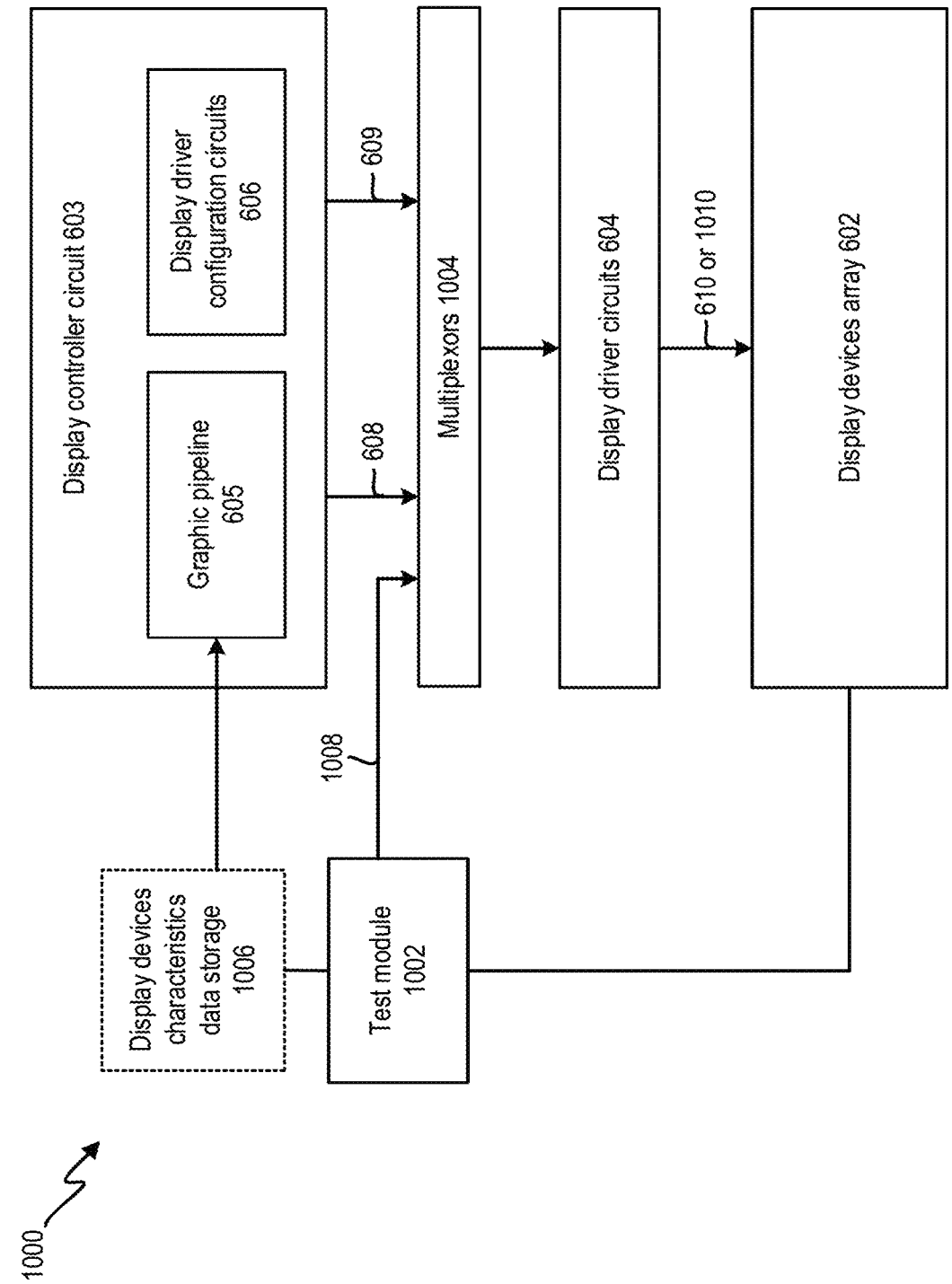
FIG. 10A and FIG. 10B illustrate examples of a display apparatus according to the disclosed techniques.
Figure 10B:
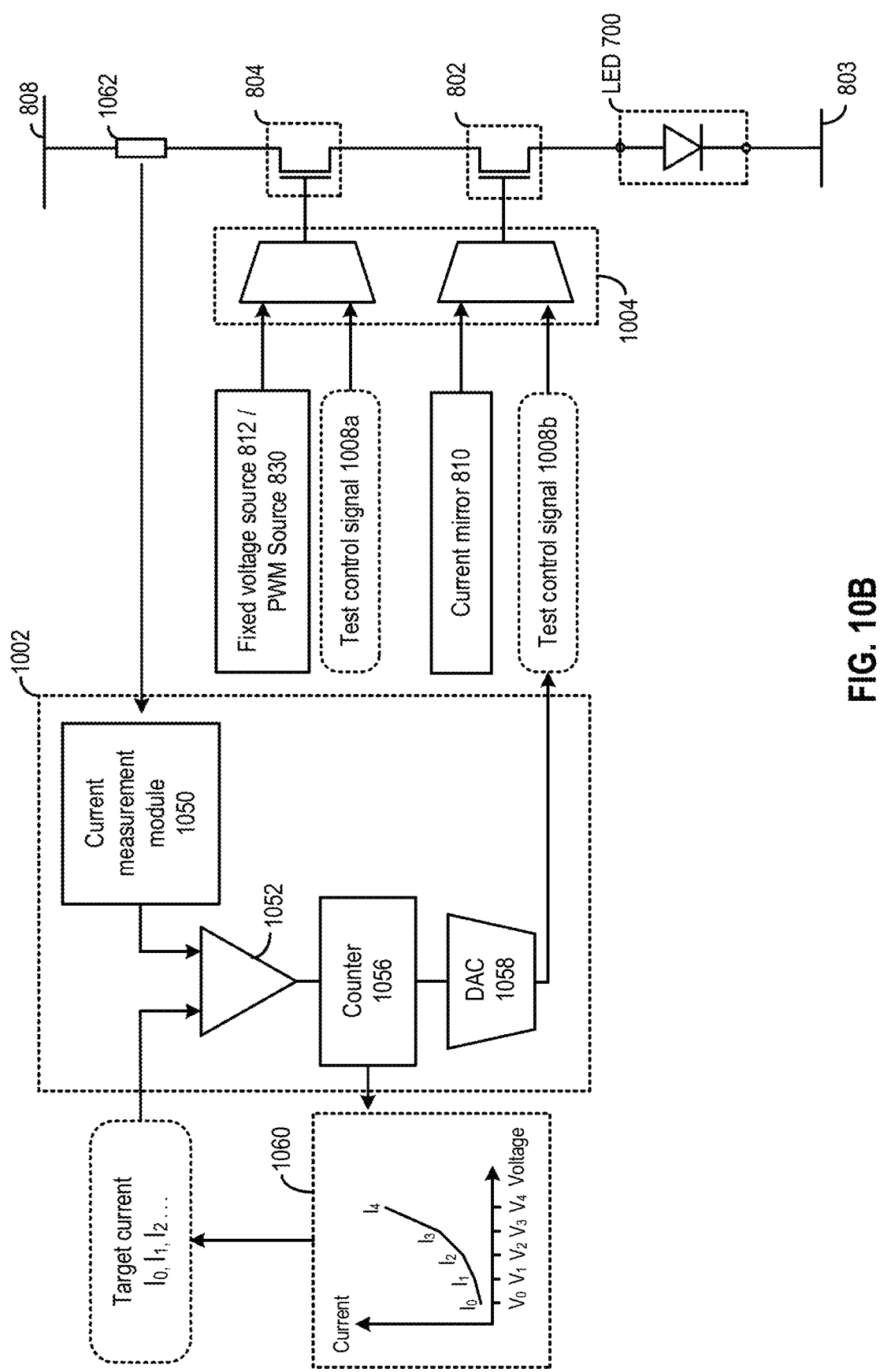

Reference is now made to FIG. 10A and FIG. 10B, which illustrate an example of a display apparatus 1000. Display apparatus 1000 can track a change in the electrical characteristics (e.g., the I-V curve) of the display devices with respect to time, and adjust the control signals to the display devices accordingly. Display apparatus 1000 can be part of display 110 of FIG. 6A and include display devices array 602, display controller circuit 603, and display driver circuits 604. In addition, display device array 602 may include an array of LED 700, and the display drivers circuits 604 may include an LED driver circuit 800 of FIG. 8A for each LED 700 of the array.

In addition, as shown in FIG. 10A, display apparatus 1000 further includes a test module 1002, a multiplexor 1004, and display devices characteristics data storage 1060. Test module 1002 can generate test control signals 1008 for determining the electrical characteristics of at least some of the display devices of display devices array 602. Depending on a mode of operation of display apparatus 1000 set by, for example, control circuitries 510, multiplexors 1004 can be configured to either forward display control signals 608 and 609 (from display controller circuit 603) or test control signals 1008 (from test module 1002) to display driver circuits 604. For example, during a normal operation mode, multiplexors 1004 can be configured to forward display control signals 608 and 609 to display driver circuits 604, which can generate display driving signals 610 based on display control signals 608 and 609, and provide display driving signals 610 to display devices array 602 to output an image. Moreover, during a test operation mode, multiplexors 1004 can be configured to forward test control signals 1008 (instead of display control signals 608 and 609) to display driver circuits 604 for at least some of the display devices of display devices array 602. Display driver circuits 604 can generate test driving signals 1010 based on test control signals 1008 and provide test driving signals 1010 to at least some of the display devices of display devices array 602, to enable test module 1002 to perform test and measurement operations on the display devices under test.

In some examples, the test and measurement operations can be performed to measure a change in the I-V curve of the display devices as a result of aging and after the display devices are subject to electrical stress caused by display driving signals 610. To obtain the I-V curve of a display device under test, test module 1002 can provide, at different times, multiple sets of test control signals 1008 to display driver circuits 604, which can then apply different voltages across the display device. Test module 1002 can measure the current that flows through the display device under test for each of the different voltages, and obtain different I-V pairs. The different I-V pairs can be used to construct a latest I-V curve (relative to prior measurements) of the display device under test, and the latest I-V curve information can be stored in display devices characteristics data storage 1060. In some examples, the I-V curves can be associated with different timestamps to enable determination of the change in the I-V curve of the display device with respect to time.

The latest I-V curve information (and/or information about a change in the I-V curve) in display devices characteristics data storage 1060 can be provided to display controller circuit 603, which can adjust display control signals 608 and 609 for a target output intensity. For example, referring back to FIG. 8B, display driver configuration circuits 606 may maintain a mapping table that maps different values of reference current 815 to different values of current 710 and the associated output intensities. Based on the latest I-V curve information, display driver configuration circuits 606 can update the estimation of the gate and source voltages of transistor 802 to achieve the different values of current 710, and adjust the values of reference current 815 in the mapping table based on the updated estimation. As another example, referring back to FIG. 8C, graphic pipeline 605 may maintain a mapping table that maps different values of on-time T1 (or duty cycle) to different target perceived output intensities. Based on the latest I-V curve information, graphic pipeline 605 may determine that the perceived output intensity decreases for the same on-time T1 due to a decrease in current 710, and can scale up the on-time values in the mapping table to account for the decrease in current 710.

In some examples, only a small subset of display devices of display devices array 602 is used for testing, and the measurement results can be used to adjust the display control signals applied to each display devices of display devices array 602. To account for differences in the characteristics, such as current-intensity characteristics (e.g., a relationship between current and output intensity), among the display devices, display devices characteristics data storage 1060 may also store a map of input scaling factors for each display device of display devices array 602. The map of input scaling factors may be determined based on the differences in the current-intensity characteristics (e.g., a relationship between current and output intensity) among the display devices, as illustrated in FIG. 9B. The current-intensity characteristics can be determined, for example, as part of wafer testing of the display devices, as part of initial testing and calibration of display apparatus 1000, etc. After determining the adjustments in the display control signals (e.g., in terms of reference current, on-time duration, etc.) for the display device under test, display controller circuit 603 can refer to the map of input scaling factors to determine a scaling factor between a target display device and the display device under test, and scale up/down the adjustment based on the scaling factor when applying the adjustment to the display control signals for the target device. With these arrangements, more accurate characterization of the changes in the electrical characteristics of the display devices with respect to time can be made, and the adjustments in the control signal can become more aligned with the actual changes in the electrical characteristics of the display devices. All these can improve the performance of display apparatus 1000.

FIG. 10B illustrates example components of test module 1002 and its operations with LED driver circuit 800. As shown in FIG. 10B, test module 1002 may include a current measurement module 1050, a comparator 1052, a counter 1056, and a digital-to-analog converter (DAC) 1058. Test module 1002 is also coupled with display devices characteristics data storage 1060, which can store a mapping between a set of bias voltages 728 and a set of target currents (e.g., $I_0$, $I_1$, $I_2$, etc.). To perform test and measurement of the I-V characteristics of LED 700, display apparatus 1000 can be controlled to enter the test operation mode, for which multiplexors 1004 can be configured to forward test control signals 1008, including test control signals 1008a and 1008b, to drive the gate terminals of transistor 804 and transistor 802 respectively. Test control signal 1008a can be used to set the drain terminal voltage of transistor 802 such that transistor 802 operates in the saturation mode. Test control signal 1008b can be generated, using a feedback loop comprising current measurement module 1050, comparator 1052, counter 1056, and DAC 1058, to obtain a gate voltage for transistor 802 to generate each of the set of target currents (e.g., $I_0$, $I_1$, $I_2$, etc.) at LED 700 stored in display devices characteristics data storage 1060. For example, to determine the gate voltage for target current $I_0$, counter 1056 can first send a first count value to DAC 1058, which can convert the digital value to output a voltage signal to the gate of transistor 802. If the source voltage of transistor 802 exceeds the threshold VF voltage of LED 700, a current can flow through transistor 802 and LED 700. The current can develop a voltage across a measurement resistor 1062 of LED driver circuit 800. The voltage can be converted (e.g., digitized) to a value representing the measured current through LED 700 by current measurement module 1050. The measured current can be compared against target current Io by counter 1056. If the measured current is below target current $I_0$, counter 1056 can count up and send a second count value to DAC 1058, which can increase the gate voltage of transistor 802 and the current through LED 700. But if the measured current matches or is above target current $I_0$, counter 1056 can freeze the count value. The count value can represent the requisite gate voltage to be applied to transistor 802 to achieve the target current $I_0$ at LED 700. The test and measurement operations can be repeated for other target currents $I_1$, $I_2$, etc., to obtain the latest I-V curve of LED 700.

Figure 11:
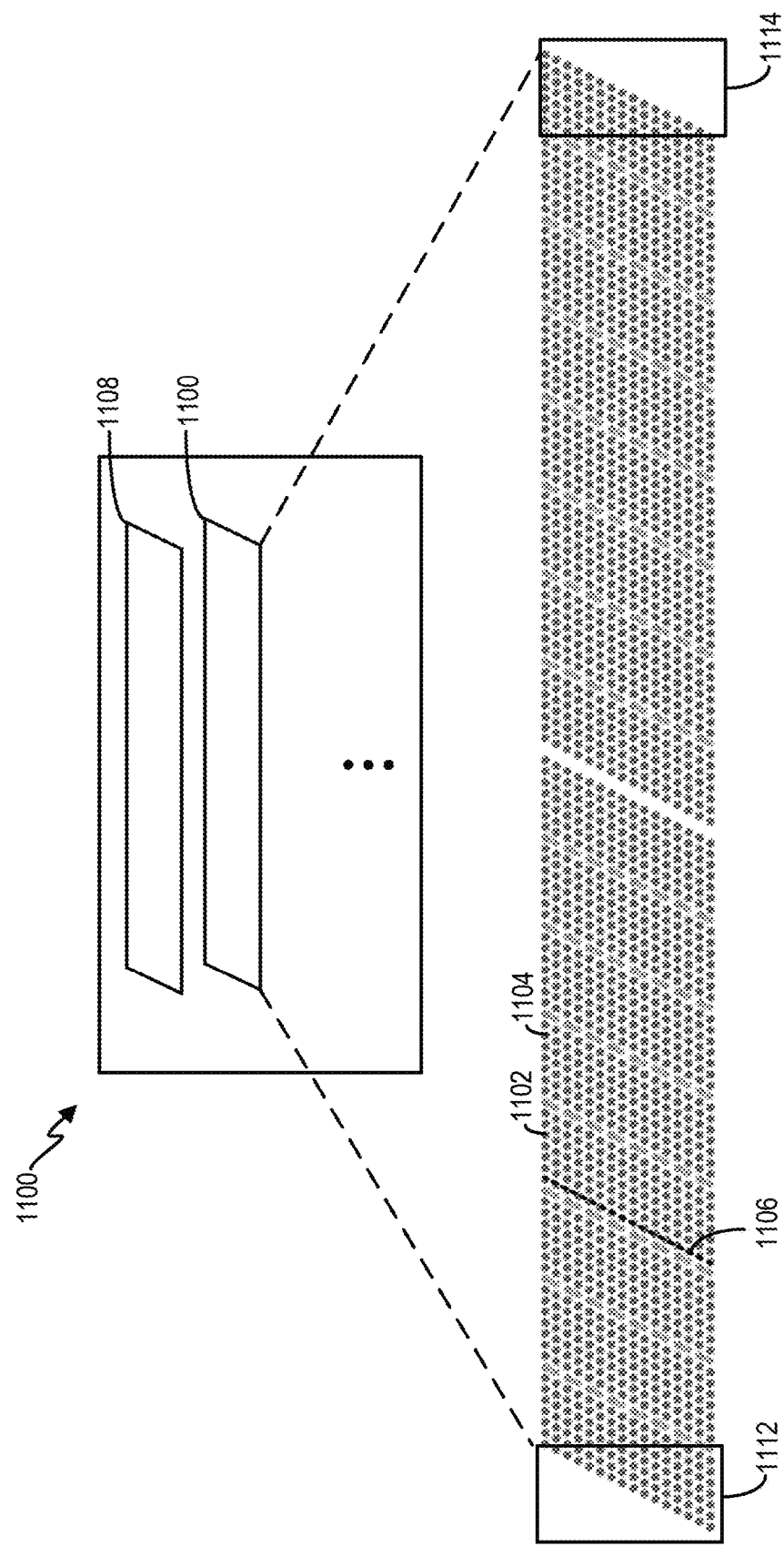
FIG. 11 illustrates an example of a display apparatus according to the disclosed techniques.

There are various ways to integrate test module 1002 with display apparatus 1000 to perform the test and measurement operations. For example, some display devices of display devices array 602 may be excluded from being used to display/output content, and can be used to perform test and measurement operations with test module 1002. FIG. 11 illustrates an example of a display apparatus 1100 that includes display devices involved in content display and display devices not involved in content display. In FIG. 11, each circular dot can represent a display device (e.g., display devices 1102, 1104, etc.). The display devices of display 100 may include, for example, LED, uLED, etc. The display devices are arranged along diagonal lines (e.g., diagonal line 1106) and can form parallelogram strips (e.g., strips 1108, 1110, etc.). To maintain a rectangular display area, display devices in the triangular areas on the two sides of each parallelogram strip (e.g., triangular areas 1112 and 1114) are not involved in the display/outputting of content, but those display devices receive the same display control signals and display driving signals as other display devices involved in the display/outputting of content and are subject to similar aging effect and electrical stress effect caused by the display control signals and display driving signals. There are various ways to exclude the display devices in the triangular areas from display/outputting of content. For example, in a case where display apparatus 1100 is used as part of a scanning display as described in FIG. 6C, mirror 620 and/or lens 624 can be sized and/or configured not to reflect light output by the display devices in the triangular areas into eyeball 630 of the user. As another example, the output surfaces of the display devices in the triangular areas can also be blocked (e.g., by a bezel) off from the user. As another example, display devices of display device array 602 that are involved in the display/outputting of content (e.g., devices that are outside the triangular areas) may also be used to perform test and measurement operations with test module 1002. For example, those display devices can be controlled to display/output content during the normal operation mode, and then controlled to perform test and measurement operations with test module 1002 during the test operation mode. In both cases, multiple display devices can be connected to test module 1002 to perform the test and measurement operations, and the measurement result from one or more of the display devices that exhibit the greatest change in the I-V characteristics can be used to determine the adjustments for the display control signals.

In addition, the timings of the test and measurement operations and the adjustment operations of the display control signals can also be selected to minimize the disruption to the display function of display apparatus 1100. For example, the test and measurement operations, and the subsequent adjustment operations the display control signals, can be performed at a time interval between the displaying of two image frames. For example, referring back to the scanning display example of FIG. 6C, the test and measurement operations and the subsequent adjustment operations the display control signals can be performed during the time between when mirror 620 reaches the second end of the angle range to reflect light for the last line of pixel of an image frame, and when mirror 620 sweeps back to the first end of the angle range to reflect light for the first line of pixel of the next image frame. In addition, the test and measurement operations and the adjustment operations of the display control signals can also be performed between non-uniform intervals based on an expected rate of change of the I-V characteristics with respect to time. For example, it may be determined that the I-V characteristics of the display devices change at a fast pace within the first year of operation, but then the pace of change falls to a lower pace after the first year of operation. In such a case, the test and measurement operations, as well as the adjustment operations of the display control signals, can be performed more frequently (e.g., once every 100 frames, etc.) in the first year of operation, and the operations can be performed less frequently (e.g., once every 1000 frames, every 10000 frames, etc.) after the first year of operation and as the time progresses. In another example, the frequency of the test and measurement operations, as well as the adjustment operations of the display control signals can also be set based on the operation conditions of the display. For example, if the display operates in an environment that can speed up the effect of aging and electrical stress (e.g., operating under a high temperature), and/or display content that require very high frequency switching for long durations of times, the test and measurement operations and the adjustment operations of the display control signals can be performed at a higher frequency to capture the change in the I-V characteristics of the display devices.

Figure 12:
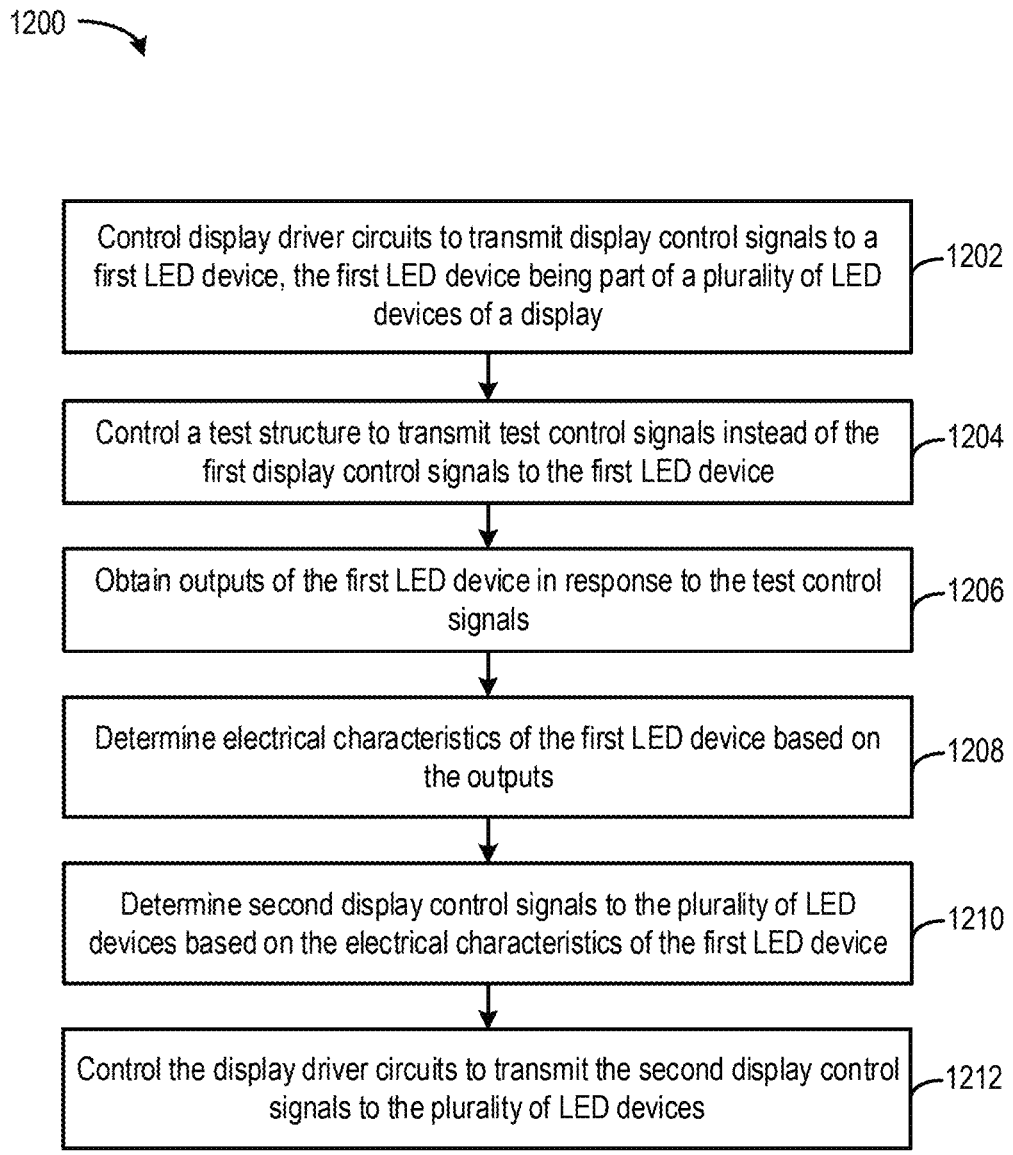
FIG. 12 illustrates a method of operating a display apparatus according to the disclosed techniques.

FIG. 12 illustrates an embodiment of a flowchart of a process 1200 of controlling a display apparatus, such as display apparatus 1000 of FIG. 10A and FIG. 10B. Display apparatus 1000 can be part of display 110 of FIG. 6A, display apparatus 1100 of FIG. 11, etc., and include display devices array 602, display controller circuit 603, and display driver circuits 604. In addition, display device array 602 may include an array of LED 700, and the display drivers circuits 604 may include an LED driver circuit 800 of FIG. 8A for each LED 700 of the array. In addition, referring to FIG. 10A, display apparatus 1000 further includes test module 1002, multiplexor 1004, and display devices characteristics data storage 1060. Process 1200 can be performed by control circuits comprising, for example, control circuitries 510 and of FIG. 5 and display controller circuit 603 of FIG. 6A and FIG. 10A.

Process 1200 begin with step 1202, where the control circuitries control display driver circuits (e.g., display driver circuits 604) to transmit display control signals to a first LED device, the first LED device being part of a plurality of LED devices of a display. In some example, the first LED device can be part of triangular areas 1112 and 1114 of display apparatus 1100 that are not involved in the display of content. The LED devices in the triangular areas may output content based on the display control signals but the triangular areas can be blocked from the viewer (e.g., by a bezel) and do not form part of the display. In some example, the first LED device can also be part of the active display area of display apparatus 1100 (e.g., display devices 1102, 1104, etc.) which can display content based on the display control signals. As described above, the display control signals can introduce aging and stress to the first LED device and can change the I-V characteristics of the first LED device.

In step 1204, the control circuits can control a test structure (e.g., multiplexors 1004 and test module 1002) to transmit test control signals instead of the first display control signals to the first LED device, to measure the latest I-V characteristics of the first LED device. The test control signals can be transmitted at, for example, a time gap between the displaying of two frames. As described above with respect to FIG. 10B, the test structure can transmit a set of test control voltages to control the first LED device to generate a set of output currents. The set of test control voltages can be configured based on a reference I-V characteristics curve of the first LED device that provide a relationship between the set of test control voltages and a set of target currents. The mapping between the test control voltages and the target currents can be stored in display devices characteristics data storage 1060.

In step 1206, the control circuits can control the test structure to obtain outputs of the first LED device in response to the test control signals. The outputs may include, for example, the output currents output by the first LED device in response to the test control voltages. The output currents can be measured by, for example, current measurement module 1050 from a voltage developed across a measurement resistor 1062 of the LED driver circuit 800 which reflects an output current.

In step 1208, the control circuits can determine electrical characteristics of the first LED device based on the outputs. For example, a new I-V characteristics curve between control voltages and output currents of the first LED device can be obtained by test module 1002 and stored in display devices characteristics data storage 1060.

In step 1210, the control circuits can determine the second display control signals to the plurality of LED devices. For example, the latest I-V curve information (and/or information about a change in the I-V curve) in display devices characteristics data storage 1060 can be provided to display controller circuit 603, which can adjust display control signals 608 and 609 for a target output intensity. For example, referring back to FIG. 8B, display driver configuration circuits 606 may maintain a mapping table that maps different values of reference current 815 to different values of current 710 and the associated output intensities. Based on the latest I-V curve information, display driver configuration circuits 606 can update the estimation of the gate and source voltages of transistor 802 to achieve the different values of current 710, and adjust the values of reference current 815 in the mapping table based on the updated estimation. As another example, referring back to FIG. 8C, graphic pipeline 605 may maintain a mapping table that maps different values of on-time T1 (or duty cycle) to different target perceived output intensities. Based on the latest I-V curve information, graphic pipeline 605 may determine that the perceived output intensity decreases for the same on-time T1 due to a decrease in current 710, and can scale up the on-time values in the mapping table to account for the decrease in current 710.

In step 1212, the control circuits can control the display driver circuits to transmit the second display control signals to the plurality of LED devices to display content.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

The invention claimed is:

1. An apparatus comprising:
a display comprising a plurality of light emitting diodes (LED);
a display control circuit configured to generate display control signals; and
a test circuit configured to generate test control signals; wherein:
in a first operation mode:
the plurality of LEDs are configured to be controlled by the display control signals from the display control circuit, at least a first subset of the plurality of LEDs being involved in outputting of an image based on the display control signals;

and in a second operation mode:

the test circuit is configured to:

supply the test control signals to cause at least one LED of the plurality of LEDs to conduct at least one target current;

measure at least one output current conducted by the at least one LED;

measure at least one output voltage across the at least one LED based on determining that the at least one output current matches the at least one target current;

determine electrical characteristics of the at least one LED based on the at least one target current and the at least one output voltage, the electrical characteristics comprising a relationship between a current that flows through the at least one LED and a voltage across the at least one LED; and provide data related to the electrical characteristics of the at least one LED to the display control circuit, to enable the display control circuit to adjust the display control signals based on the electrical characteristics of the at least one LED.

2. The apparatus of claim 1, wherein a second subset of the plurality of LEDs is not involved in the outputting of the image; and wherein the at least one LED is part of the second subset of the plurality of LEDs.

3. The apparatus of claim 1, wherein the at least one LED is part of the first subset of the plurality of LEDs.

4. The apparatus of claim 1, wherein the apparatus is configured to enter the second operation mode at a time between when the display outputs a first image frame and when the display outputs a second image frame.

5. The apparatus of claim 4, further comprising a rotatable mirror configured to rotate from a first angle towards a second angle relative to the display to reflect light of different rows of the plurality of LEDs to a user at different times to output the first image frame; and wherein the apparatus is configured to enter the second operation mode when the rotatable mirror rotates from the second angle back to the first angle to start outputting the second image frame.

6. The apparatus of claim 1, wherein the apparatus is configured to enter the second operation mode between non-uniform time intervals; and wherein the non-uniform time intervals increase with time.

7. The apparatus of claim 1, further comprising display driver circuits configured to:

in the first operation mode:

generate display driving signals based on the display control signals from the display control circuit; and provide the display driving signals to the plurality of LEDs; and in the second operation mode:

generate test driving signals based on the test control signals from the test module circuit; and provide the test driving signals to the at least one LED.

8. The apparatus of claim 7, wherein the test driving signals are configured to set a first voltage across the at least one LED; and wherein the at least one output current is conducted by the at least one LED in response to the first voltage.

9. The apparatus of claim 7, wherein the test driving signals are configured to set a plurality of voltages across the at least one LED at different times within the second operation mode; and wherein the display driver circuits are configured to exit the second operation mode when the at least one output current conducted by the at least one LED responsive to one of the plurality of voltages matches the at least one target current.

10. The apparatus of claim 9, wherein the test circuit includes:

a current measurement device configured to measure the at least one output current;

a comparator configured to compare an output of the current measurement device and the at least one target current to provide an indication of whether the at least one output current matches the at least one target current;

a counter configured to adjust a count value based on the indication from the comparator that the at least one output current matches the at least one target current; and a digital-to-analog converter (DAC) configured to generate the test driving signals based on the count value from the counter.

11. The apparatus of claim 7, wherein the test module circuit is configured to:

provide different sets of test control signals to the display driver circuits to obtain measurement data of a plurality of voltages across the at least one LED and to obtain a plurality of currents that flow through the at least one LED in response to the plurality of voltages; and determine the electrical characteristics of the at least one LED by mapping the plurality of currents to the plurality of voltages.

12. The apparatus of claim 7, wherein the display driver circuits include a first transistor configured as variable current source, a gate terminal of the first transistor being driven by the test driving signals in the second operation mode, and a source terminal of the first transistor being coupled with the at least one LED.

13. The apparatus of claim 12, wherein the test control signals comprise a first test control signal and a second test control signal, the gate terminal of the first transistor being driven by the first test control signal in the second operation mode;

wherein the apparatus further comprises a second transistor configured as a voltage buffer;

wherein a drain terminal of the first transistor is coupled with an voltage output of the voltage buffer; and wherein a gate terminal of the second transistor is driven by the second test control signal in the second operation mode.

14. The apparatus of claim 1, wherein the test circuit is configured to:

determine, at a first time, first electrical characteristics of the at least one LED; and obtain data of second electrical characteristics of the at least one LED, the second electrical characteristics being associated with a second time prior to the first time, wherein the data related to the electrical characteristics of the at least one LED comprise data related to a difference between the first electrical characteristics and the second electrical characteristics.

15. The apparatus of claim 14, wherein the display control signals generated by the display control circuit comprise a first pulse width modulation (PWM) signal, a first duty cycle of the first PWM signal being set to control a perceived intensity of light output by the at least one LED; and wherein the display control circuit is configured to adjust the first duty cycle of the first PWM signal based on the difference such that a perceived intensity of light output by the at least one LED at the first time is substantially equal to a perceived intensity of light output by the at least one LED at the second time.

16. The apparatus of claim 15, wherein the display control signals generated by the display control circuit comprises a second PWM signal, a second duty cycle of the second PWM signal being set to control a perceived intensity of light output by a second LED of the plurality of LEDs; and wherein the display control circuit is configured to adjust the second duty cycle of the second PWM signal based on the difference and an intensity factor between the at least one LED and the second LED, such that a perceived intensity of light output by the second LED at the first time is substantially equal to a perceived intensity of light output by the second LED at the second time.

17. The apparatus of claim 14, wherein the display control signals generated by the display control circuit comprise a first current setting signal, the first current setting signal being set to control the at least one output current conducted by the at least one LED; and wherein the display control circuit is configured to adjust the first current setting signal based on the difference such that an intensity of light output by the at least one LED at the first time is substantially equal to an intensity of light output intensity of light output by the at least one LED at the second time.

18. The apparatus of claim 17, wherein the display control signals generated by the display control circuit comprise a second current setting signal, the second current setting signal being set to control a second current that flows through a second LED; and wherein the display control circuit is configured to adjust the second current setting signal based on the difference and an intensity factor between the at least one LED and the second LED, such that an intensity of light output by the second LED at the first time is substantially equal to an intensity of light output by the second LED at the second time.

19. A method comprising:

in a first operation mode, controlling a plurality of LEDs of a display based on display control signals from a display control circuit to output an image;

in a second operation mode:
controlling at least one LED of the plurality of LEDs based on test control signals from a test circuit to conduct at least one target current;

measuring, by the test circuit, at least one output current conducted by the at least one LED;

measuring, by the test circuit, at least one voltage across the at least one LED based on determining that the at least one output current matches the at least one target current determining, by the test circuit, electrical characteristics of the at least one LED, the electrical characteristics comprising a relationship between the at least one voltage and the at least one target current; and providing, by the test circuit to the display control circuit, data related to the electrical characteristics of the at least one LED, to enable the display control circuit to adjust the display control signals based on the electrical characteristics of the at least one LED.

20. The method of claim 19, further comprising, in the second operation mode:

comparing the at least one output current against the at least one target current to determine whether the at least one output current matches the at least one target current;

adjusting the test control signals to adjust the at least one output current based on a result of the comparison; and responsive to determining that the at least one output current matches the at least one target current:
storing a mapping between the at least one voltage and the at least one target current to represent the electrical characteristics of the at least one LED.

* * * * *